US012057936B1

(12) United States Patent
Newman et al.

(10) Patent No.: US 12,057,936 B1
(45) Date of Patent: Aug. 6, 2024

(54) FAULT CORRECTION BASED ON MEANING OR INTENT OF 5G/6G MESSAGES

(71) Applicants: David E. Newman, Poway, CA (US); R. Kemp Massengill, Palos Verdes, CA (US)

(72) Inventors: David E. Newman, Poway, CA (US); R. Kemp Massengill, Palos Verdes, CA (US)

(*) Notice: Subject to any disclaimer, the term of this patent is extended or adjusted under 35 U.S.C. 154(b) by 0 days.

(21) Appl. No.: 18/648,356

(22) Filed: Apr. 27, 2024

Related U.S. Application Data

(63) Continuation of application No. 18/502,054, filed on Nov. 5, 2023, now Pat. No. 12,003,323, which is a continuation of application No. 18/462,124, filed on Sep. 6, 2023, now Pat. No. 11,848,774, which is a continuation of application No. 18/318,017, filed on May 16, 2023, now Pat. No. 11,799,585.

(60) Provisional application No. 63/448,422, filed on Feb. 27, 2023, provisional application No. 63/496,769, filed on Apr. 18, 2023, provisional application No. 63/497,844, filed on Apr. 24, 2023, provisional application No. 63/463,167, filed on May 1, 2023, provisional application No. 63/464,686, filed on May 8, 2023, provisional application No. 63/403,924, filed on Sep. 6, 2022, provisional application No.
(Continued)

(51) Int. Cl.
*H04L 1/00* (2006.01)
(52) U.S. Cl.
CPC .......... *H04L 1/0046* (2013.01); *H04L 1/0061* (2013.01); *H04L 1/0064* (2013.01)

(58) Field of Classification Search
CPC ... H04L 1/0046; H04L 1/0061; H04L 1/0064; H04L 1/0076; H04L 1/203; H04L 25/02; H03M 13/41; H03M 13/09; H03M 13/6579; G06N 3/08
See application file for complete search history.

(56) References Cited

U.S. PATENT DOCUMENTS

| 5,371,471 A | 12/1994 | Chennakeshu |
| 2007/0089036 A1 | 4/2007 | Jiang |
| 2007/0089037 A1 | 4/2007 | Jiang |

(Continued)

OTHER PUBLICATIONS

Jagannath et al., Redefining wireless communication for 6G: signal processing meet deep learning with deep unfolding, IEEE, Trans. on AI, vol. 2, No. 6, pp. 528 to 536. (Year: 2021).*

*Primary Examiner* — Shelly A Chase

(57) ABSTRACT

A receiver may use a trained AI model to recover a faulted 5G/6G message by interpreting the meaning or intent of the message by correlating the message content with one of the "expected" message types. For example, the AI model may consider changes to the message, for consistency with an associated error-detection code, thereby producing a series of candidate messages. The AI model can then determine a likelihood that each of the candidate messages is correct, in the context of the receiver (such as an action or condition of the receiver, or a planned activity of the receiver) or is commonly received in that context. For example, the AI model can be trained to recognize the expected messages or message types, and thereby indicate which candidate message has the highest likelihood of being correct. The AI model may also consider waveform parameters to identify likely faults.

20 Claims, 24 Drawing Sheets

Related U.S. Application Data

63/418,784, filed on Oct. 24, 2022, provisional application No. 63/447,167, filed on Feb. 21, 2023.

(56) References Cited

U.S. PATENT DOCUMENTS

| | | |
|---|---|---|
| 2008/0123788 A1 | 5/2008 | Wongwirawat |
| 2009/0046771 A1 | 2/2009 | Abe |
| 2012/0311409 A1 | 12/2012 | Pedersen |
| 2013/0100988 A1 | 4/2013 | Miyoshi |
| 2013/0163656 A1 | 6/2013 | Sakamoto |
| 2013/0346826 A1 | 12/2013 | Zopf |
| 2014/0056342 A1 | 2/2014 | Baker |
| 2016/0323091 A1 | 11/2016 | Inoue |
| 2017/0359120 A1 | 12/2017 | Jacobs |
| 2018/0357530 A1 | 12/2018 | Beery |
| 2021/0110261 A1* | 4/2021 | Lee ..................... H04L 5/0055 |
| 2021/0119734 A1 | 4/2021 | Mheich |
| 2021/0119930 A1 | 4/2021 | Debbage |
| 2021/0377763 A1 | 12/2021 | Tian |
| 2021/0383207 A1 | 12/2021 | Beery |
| 2021/0383220 A1 | 12/2021 | Beery |
| 2022/0123825 A1 | 4/2022 | Mehrabani |
| 2022/0141064 A1 | 5/2022 | Horn |
| 2022/0166565 A1 | 5/2022 | Maki |
| 2022/0231785 A1 | 7/2022 | Beery |
| 2023/0198672 A1* | 6/2023 | Saber ..................... G06N 3/08 714/776 |

* cited by examiner

One Symbol-time

One Symbol-time

FIG. 16

- 1601 - Receive a message. Determine that it disagrees with appended hard-decision error-detection code (such as CRC or basic parity or LDPC).
- 1602 - Determine waveform fluctuations, modulation distances, and suspiciousness for each message element, including the error-detection code. Select worst one.
- 1603 - Back-calculation feasible?
  - N:
    - 1604 - Replace worst message element with another legal modulation state.
    - 1605 - Agrees with code?
      - N:
        - 1606 - Replace worst and second-worst message elements with other legal modulation states in nested grid search.
        - 1607 - Agrees with code?
          - N: 1609 - Request retransmission.
          - Y: 1608 - Done.
      - Y: 1608 - Done.
  - Y:
    - 1611 - Calculate corrected value of worst message element(s) based on the error-detection code.
    - 1612 - Agrees with code?
      - N:
        - 1614 - Replace second-worst message element with another legal modulation state. Recalculate worst one based on error-detection code.
        - 1615 - Agrees with code?
          - N: 1617 - Request retransmission.
          - Y: 1616 - Done.
      - Y: 1616 - Done.
- 1618 - Optionally, check message content against required format, range limits, meaning or intent, expected type.

FIG. 19

1901 - Provide input values, related to fault probability, to an AI model:

-- Amplitude and phase fluctuations.
-- Amplitude and phase modulation deviations.
-- Received amplitude or power (average over the message element).
-- Noise and interference (from demodulation reference and blanks).
-- FEC or CRC or parity code if provided.
-- Demodulation reference(s) used for demodulation of this message.
-- Polarization of each message element.
-- Frequency offset of each message element.
-- Smoothness of transitions between symbols.
-- Historical record of similar messages.
-- Type and format requirements.
-- Other rules and limits governing content.

1902 - Operate the AI model.

1903 - Determine the AI model outputs:

-- Fault probability of each message element.
-- The most likely corrected message version OPTIONAL:
-- Uncertainty of each prediction.
-- The corrected value of each faulted message element(s).
-- Interpretation of most probable message meaning, and its uncertainty.
-- Tabulation of multiple candidate message versions, along with probability estimates for each version and for each message element of each version.

FIG. 25

| | MODULATION STATES | | | | | | | | FAULT PROBABILITY |
|---|---|---|---|---|---|---|---|---|---|
| | A | B | C | D | E | F | G | H | |
| 2501 | 0 | 0 | 0 | 1 | 0 | 0 | 0 | 0 | 0.0 |
| 2502 | 0 | 0.9 | 0 | 0.1 | 0 | 0 | 0 | 0 | 0.05 |
| 2503 | 0 | 0 | 0 | 0 | 0.6 | 0.4 | 0 | 0 | 0.7 |
| 2504 | 0 | 0 | 0 | 0 | 0 | 0 | 0 | 0 | 1.0 |

2500, 2505, MESSAGE ELEMENTS

FIG. 26

2601 - Obtain or develop an AI model, trained to detect and correct faults by correlating waveform data and an error-detection code.

2602 - Receive a message and test using error-detection code.

2603 - Agrees with code?

2605 - Provide waveform and code data to AI model. (N)

2604 - Done. (Y)

2606 - Determine, as output, most likely corrected message version.

2607 - Optionally, determine fault locations, fault types, other fault info as output.

2608 - Optionally, check the corrected version for "reasonableness". (May use same AI model. Request retransmission if not ok.)

2609 - Optionally, review the correction later, with additional information. Adjust AI model variables if the correction was unsuccessful.

FIG. 27

2701 - WAVEFORM DATA FOR EACH MESSAGE ELEMENT:
Average amplitude and phase in symbol-time.
Width and skew of amplitude distribution.
Width and skew of phase distribution.
Amplitude deviation from closest modulation level and from message average.
Phase deviation from closest modulation level and from message average.
Polarization component ratio.
Transition interval smoothness or rate-of-change.
Frequency offset relative to subcarrier nominal or to message average.

2702 - MESSAGE CONTENT DATA:
Message elements as best demodulated.
Type, form, and format of message.
Demodulation reference used for demodulating the message.
  (And waveform data for that demodulation reference.)

2703 - ERROR-DETECTION CODE DATA:
Same waveform data as for the message elements.
Predetermined type and properties of the code.
Demodulated value of each resource element of the code.

2704 - OTHER DATA:
Environmental data: noise and interference including phase and amplitude.
Historical data: previous bit/symbol sequences for this type of message.
    (Including sequences almost never encountered, and their context.)
Context data: Expected message type and expected meaning or intent.

2705 - AI MODEL

2706 - AI OUTPUT
Most likely corrected message version.
Other versions, with their likelihood values.
Alert if two versions have equal likelihood.
Alert if best likelihood is poor.
Fault locations and fault types, based on best version.
Interpretation of message - intent or meaning.

FAULT CORRECTION BASED ON MEANING OR INTENT OF 5G/6G MESSAGES

PRIORITY CLAIMS AND RELATED APPLICATIONS

This application is a continuation of U.S. patent application Ser. No. 18/502,054, entitled "AI Model with Error-Detection Code for Fault Correction in 5G/6G", filed Nov. 5, 2023, which is a continuation of U.S. patent application Ser. No. 18/462,124, entitled "AI-Based Analog-Digital Fault Detection and Localization in 5G/6G", filed Sep. 6, 2023, which is a continuation of U.S. patent application Ser. No. 18/318,017, entitled "Error Correction in 5G and 6G using AI-Based Analog-Digital Correlations", filed May 16, 2023, which claims the benefit of U.S. Provisional Patent Application Ser. No. 63/403,924, entitled "Phase-Noise Mitigation at High Frequencies in 5G and 6G", filed Sep. 6, 2022, and U.S. Provisional Patent Application Ser. No. 63/418,784, entitled "Demodulation for Phase-Noise Mitigation in 5G and 6G", filed Oct. 24, 2022, and U.S. Provisional Patent Application Ser. No. 63/447,167, entitled "Incremental Realtime Signal-Quality Feedback in 5G/6G", filed Feb. 21, 2023, and U.S. Provisional Patent Application Ser. No. 63/448,422, entitled "AI-Managed Channel Quality Feedback in 5G/6G", filed Feb. 27, 2023, and U.S. Provisional Patent Application Ser. No. 63/496,769, entitled "Waveform Indicators for Fault Localization in 5G and 6G Messages", filed Apr. 18, 2023, and U.S. Provisional Patent Application Ser. No. 63/497,844, entitled "Artificial Intelligence for Fault Localization and Mitigation in 5G/6G", filed Apr. 24, 2023, and U.S. Provisional Patent Application Ser. No. 63/463,167, entitled "Signal Quality Input for Error-Detection Codes in 5G and 6G", filed May 1, 2023, and U.S. Provisional Patent Application Ser. No. 63/464,686, entitled "Error Correction in 5G and 6G using AI-Based Analog-Digital Correlations", filed May 8, 2023, all of which are hereby incorporated by reference in their entireties.

FIELD OF THE INVENTION

The disclosure pertains to wireless messaging, and more particularly to methods for localizing and mitigating faults in messages.

BACKGROUND OF THE INVENTION

Reliability is a key requirement, and a major challenge, for next-generation wireless communications. Signal fading at high frequencies and interference due to crowded network spaces are unavoidable sources of message faulting. Increasing the transmission power is a futile way to improve reception, because the competing transmitters will follow suit. What is needed is a way to identify and correct message faults, in real-time, with low complexity procedures that simple IoT receivers can perform. Successfully mitigating messages without the delays and costs of a retransmission would enable higher throughput, longer ranges, and improved reliability, especially for demanding low-latency applications.

This Background is provided to introduce a brief context for the Summary and Detailed Description that follow. This Background is not intended to be an aid in determining the scope of the claimed subject matter nor be viewed as limiting the claimed subject matter to implementations that solve any or all of the disadvantages or problems presented above.

SUMMARY OF THE INVENTION

In a first aspect, there is a method for a wireless receiver to demodulate a message, the method comprising: receiving a received message and a received error-detection code; determining, according to a disagreement between the received message and the received error-detection code, that the received message or the received error-detection code, or both, is or are corrupted; providing, as input to an artificial intelligence ("AI") model, the received message and the received error-detection code; determining, as output from the AI model, a plurality of candidate versions, each version comprising: a candidate message; a candidate error-detection code that is consistent with the candidate message; and a likelihood value indicating an estimated likelihood that the candidate message is correct; wherein, for each version: when the candidate message differs from the received message, the candidate error-detection code equals the received error-detection code; and when the candidate error-detection code differs from the received error-detection code, the candidate message equals the received message.

In another aspect, there is non-transitory computer-readable media in a wireless receiver, the non-transitory computer-readable media containing instructions that, when executed by a computing environment, cause a method to be performed, the method comprising: using an artificial intelligence ("AI") model which has been trained to determine a likelihood value of a message comprising symbols, according to data about the wireless receiver and the message symbols; receiving a received message and a received error-detection code, and determining, according to a disagreement between the received message and the received error-detection code, that the received message or the received error-detection code, or both, is or are faulted; providing, as input to the AI model, the received message and the received error-detection code; and determining, as output from the AI model, a plurality of candidate versions, each candidate version comprising a candidate message, a candidate error-detection code consistent with the candidate message, and a likelihood value indicating a likelihood that the candidate message is correct.

In another aspect, there is a method for a wireless receiver to correct a message fault, the method comprising: receiving a message comprising an error-detection code, and determining, according to a disagreement between the message and the error-detection code, that the message or the error-detection code, or both, is or are corrupted; providing, as input to an artificial intelligence ("AI") model, the message and the error-detection code; determining, as output from the AI model, a plurality of candidate messages, and a likelihood value associated with each of the candidate messages, the likelihood value indicating a likelihood that the candidate message is correct.

This Summary is provided to introduce a selection of concepts in a simplified form. The concepts are further described in the Detailed Description section. Elements or steps other than those described in this Summary are possible, and no element or step is necessarily required. This Summary is not intended to identify key features or essential features of the claimed subject matter, nor is it intended for use as an aid in determining the scope of the claimed subject matter. The claimed subject matter is not limited to implementations that solve any or all disadvantages noted in any part of this disclosure.

These and other embodiments are described in further detail with reference to the figures and accompanying detailed description as provided below.

BRIEF DESCRIPTION OF THE DRAWINGS

FIG. 16 is a flowchart showing an exemplary embodiment of a procedure for mitigating a message according to a hard-decision code and waveform data, according to some embodiments.

FIG. 19 is a flowchart showing an exemplary embodiment of a procedure for determining the probability that a message element is faulted according to a waveform, according to some embodiments.

FIG. 25 is a chart showing an exemplary embodiment of probability values for each message element having each of the modulation states, according to some embodiments.

FIG. 26 is a flowchart showing an exemplary embodiment of a procedure for using an AI model to correlate waveform data with an error-detection code to mitigate faults, according to some embodiments.

FIG. 27 is a flowchart showing another exemplary embodiment of a procedure for using an AI model to correlate waveform data with an error-detection code to mitigate faults, according to some embodiments.

Like reference numerals refer to like elements throughout.

DETAILED DESCRIPTION

Figure 1A:
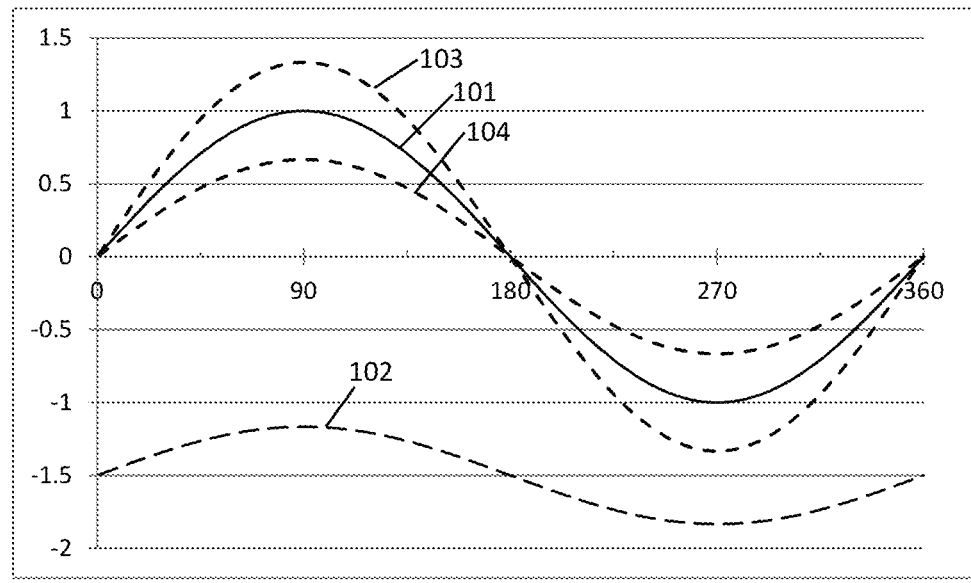
FIG. 1A is a schematic showing an exemplary embodiment of a signal waveform with and without interference, according to some embodiments.

Systems and methods disclosed herein (the "systems" and "methods", also occasionally termed "embodiments" or "arrangements" or "versions" or "examples", generally according to present principles) can provide urgently needed wireless communication protocols for identifying faults according to certain fault indicators in the received waveform of each resource element of the message. An AI model may identify specific errors based on correlations between the waveform "analog" data and the "digital" data of an error-detection code associated with the message. The AI model can then correct the faults using a combination of the waveform data of each message element and the error-detection code. (As used herein, a "message element" is a resource element of the message.)

The received waveform of a faulted signal is rich with information indicating the fault. An alert receiver can detect these fault indicators and thereby identify the fault locations, leading to a prompt mitigation using the error-detection code. Fault indicators include fluctuations in amplitude or phase of the as-received waveform, amplitude and phase deviations relative to predetermined modulation levels, amplitude and phase irregularities relative to an average modulation for each message element as-received. Further fault indicators include irregularities in the polarization of the received signal, a frequency offset relative to the subcarrier frequency, and certain inter-symbol transition features of the waveform. Each of these waveform irregularities may reveal the faulted message elements while exonerating the rest of the message. Additional fault tests include the form and format of the message, its content relative to commonly received bit sequences or character sequences of similar messages, and the intent or meaning of the message, as interpreted by the AI model. Using these fault indicators and the error-detection code, the AI model can identify the most likely faulted message elements and determine a correction in real-time, in many cases, without the costs and delays of a retransmission. The AI model can also determine, from the waveform data, when the message has too many faults, or when the proposed corrections all have low probability, in which case the receiver can immediately request a retransmission instead of wasting time searching further. In addition, when the faulted message elements are clustered in a portion of the message, the AI model can indicate which portion should be retransmitted, instead of sending the whole message a second time, saving power and time.

The receiver can complete the signal processing electronically before presenting the measured fault indicators to the AI model. The receiver can determine the distribution of fluctuations in amplitude or phase in each message element's waveform, based on the digitized waveform signal of each message element. The receiver can determine an average amplitude or phase of the waveform within each message element, and then determine the variations in amplitude or phase relative to the average. The receiver can also determine the modulation deviation of each message element by measuring the difference between the modulation state of the received message element and the closest predetermined state of the modulation scheme. For enhanced sensitivity, the receiver can determine a difference between the amplitude or phase of each message element relative to an average of other message elements that have the same demodulated value in the same message. The receiver can also check the received polarization, the inter-symbol waveform transition, and the frequency offset relative to the nominal subcarrier frequency or a message average. All of these can contribute to a determination of the signal quality of each message element.

In addition, the receiver (or the AI model) can augment the waveform diagnostics by testing the format, content, and meaning or intent of the message versus the expected values, and thereby localize the suspicious message elements. Alternatively, the receiver can let an AI model do the fault localization and correction based on the listed data and the error-detection code, by exploiting hidden correlations between the waveform data, the error code, and the meaning or intent of the message.

In some cases, the error-detection code is embedded in or concatenated with the message, so that the "message" in that case includes its error-detection code. In such cases, the term "message elements" include resource elements containing the content of the message as well as the resource elements of the error-detection code. It is immaterial whether the error-detection code is embedded in, or concatenated with, or separate from, the message.

Embodiments of an AI model that discern correlations between the waveform data and the error-detection code can determine a most-likely correction of the message. Alternatively, the AI model can suggest multiple candidate messages along with the likelihood of each. The AI model can thereby mitigate the message faults, at negligible operating cost, as explained below.

The procedures disclosed below may be adapted to the modulation scheme of the message. For example, if the message is modulated in QAM (involving two orthogonal amplitude-modulated signals) then the receiver can measure amplitude fluctuations in both I and Q branch amplitudes, since either can reveal interference in the faulted message element. The receiver can also measure variations in phase (according to a ratio of the two branch amplitudes) which can also indicate the faulted message element. Alternatively, instead of QAM, the message may be modulated in amplitude and phase of the raw waveform. In that case, the receiver can reveal the fault by measuring the width of the amplitude distribution and the width of the phase distribution for each message element. If PSK modulation is used, involving just phase modulation, the receiver can still measure both amplitude and phase, since wide fluctuations in either parameter indicates a likely faulted message element. In addition, the receiver can measure the deviation or distance between the received modulation state of each message element and the closest predetermined modulation level. Large modulation deviations indicate likely faulted message elements. Similar tests are described for polarization, waveform transitions between symbols, and frequency offsets of each signal relative to the subcarrier frequency, each of which can indicate a likely fault. In many cases, the fault indications from each of these tests may be subtle, but when multiple fault tests are combined and correlated by the AI model, the composite result may reveal the faulted message element with greater statistical significance.

The AI model may exploit hidden correlations between the waveform data and the error-detection code, such as a CRC or Turbo or Polar or LDPC or other parity construct. The waveform data, when combined with the error-detection code, can mitigate the likely faulted message elements in many cases. AI works best when presented with two information sets having very different properties, such as the analog information of the waveform and the digital information of the error-detection code. AI can also excel at figuring out the intent or meaning of the message, despite faults. The AI model can localize the fault or faults according to the waveform irregularities and then use the error-detection codes to correct the faulted message elements. Some types of error-detection codes purport to determine both the location and the corrected value of faults, although with many limitations and high computational costs. By using correlations between the waveform data and the error-detection code, the AI model can greatly reduce the amount of time, computation, and energy involved in correcting the message. In addition, the AI model can generate multiple candidate messages in which the faulted message elements and the error-detection code are altered in different ways, and can select the one that makes sense based on the content of the message.

Some types of error-detection codes, such as Turbo and Polar codes, include non-binary or "extrinsic" information (that is, not just 1's and 0's). The AI model can readily include the waveform data along with the modulation data, and can then use this enhanced extrinsic information to facilitate the mitigation process.

Other error-detection codes (such as CRC codes) indicate only whether the message is corrupted, but not where. In that case, the AI model can use the waveform data to indicate which message elements are likely faulted, thereby facilitating a rapid recovery. Various other codes (such as LDPC) have versions with and without extrinsic information, with and without fault localization, with and without indicating the corrected values. In each case, the extra information provided by the waveform analysis in conjunction with the error-detection code can enhance the mitigation by narrowing the search for the faulted message elements and indicating the most likely corrected value of those message elements. Embodiments may thereby enable even a reduced-capability IoT receiver to correct faults rapidly, without a retransmission, and at very low cost. A well-trained AI model can perform each of these tasks better than any human, faster than any human, and at insignificant cost after development, according to some embodiments.

Many applications of the disclosed procedures are foreseen in wireless communications, especially those with extremely tight latency and reliability requirements. For example, an autonomous vehicle could rely on a safety instruction message received from a traffic monitor. If the message is faulted, it is essential that the receiver be able to detect, localize, and correct the faults quickly, before a collision occurs. Lives could depend on fault mitigation in this and other high-priority cases.

Embodiments of the procedures disclosed herein may be suitable for incorporation into a proprietary signal processing circuit, which may provide fast and automatic fault DL&C (detection, localization, and correction) upon receipt of each message, thereby successfully recovering each message fault before receiving the next OFDM symbol. Due to the increasing importance of communication reliability in next-generation networks, especially those with severe interference and propagation challenges, the AI-based real-time fault localization procedures disclosed herein may provide a key solution opportunity.

Glossary of Terms

Terms herein generally follow 3GPP (third generation partnership project) standards, but with clarification where needed. Jargon, ambiguous terms, and unhelpful acronyms are avoided. As used herein, "5G" represents fifth-generation (including 5G Advanced), and "6G" represents sixth-generation, wireless technology. A network (or cell or "LAN" Local Area Network or "RAN" Radio Access Network or the like) may include a base station (or "gNB" or generation-node-B or "eNB" or evolution-node-B or "AP" Access Point) in signal communication with a plurality of user devices (or "UE" or User Equipment or user nodes or terminals or wireless transmit-receive units) and operationally connected to a core network ("CN") which handles non-radio tasks, such as administration, and is usually connected to a larger network such as the Internet. The time-frequency space is generally configured as a "resource grid" including a number of "resource elements", each resource element being a specific unit of time termed a "symbol period" or "symbol-time", and a specific frequency and bandwidth termed a "subcarrier". Symbol periods may be termed "OFDM symbols" (Orthogonal Frequency-Division Multiplexing) in which the individual signals of multiple subcarriers are added in superposition. "QAM" or "quadrature" amplitude modulation (sometimes "PAM") refers to two amplitude-modulated signals with a 90-degree phase shift between them. The two signals may be called the "I" and "Q" branch signals (for In-phase and Quadrature-phase) or "real and imaginary" among others. "LLR" stands for log-likelihood ratio, a measure of uncertainty or probability.

"AI" means artificial intelligence, or computer-based decision-making based on learned examples. "Classical" amplitude-phase modulation (sometimes "polar" modulation, "APSK" amplitude phase shift keying, "PQAM" polar quadrature amplitude modulation, and others) refers to message elements modulated in both amplitude and phase. Each of those terms applies to just a subset of general amplitude-phase modulation, and therefore are avoided herein. "SNR" (signal-to-noise ratio) and "SINR" (signal-to-interference-and-noise ratio) are used interchangeably unless specifically indicated. "Digitization" refers to repeatedly measuring a waveform using, for example, a fast "ADC" (analog-to-digital converter) or the like. System information messages include the "SSB" (synchronization signal block) and "SIB1" (system information block number 1) among others. "FEC" codes are forward error-correction codes provided with a message to attempt to correct errors. "CRC" are cyclic redundancy codes indicating whether a message is corrupted, but do not attempt to correct them (hence, CRC codes are not FEC codes). "LDPC" codes are low-density parity codes also indicating fault conditions. "Polar" and "Turbo" codes are error-detection codes that employ extrinsic information, which is information other than binary information. "Hard-decision" codes assign binary values (0 or 1) to variables, while "soft-decision" codes assign values other than binary. "FFT" (fast Fourier transform) converts a waveform to a spectral distribution or vise-versa.

In addition to the 3GPP terms, the following terms are defined. Although in references a modulated resource element of a message may be referred to as a "symbol", this may be confused with the same term for a time interval ("symbol-time"), or a composite waveform or "OFDM symbol" (orthogonal frequency-division multiplexing), each character in a demodulated message, among many other things. To avoid ambiguities herein, each modulated resource element of a message is referred to as a "modulated message resource element", or more simply as a "message element", in examples below. A "demodulation reference" is one or more modulated "reference resource elements" or "reference elements" modulated according to the modulation scheme of the message and configured to exhibit levels of the modulation scheme (as opposed to conveying data). A "calibration set" is one or more predetermined amplitude levels and/or phase levels of a modulation scheme, typically determined by a demodulation reference. A "short-form" demodulation reference is a demodulation reference that exhibits only selected amplitude levels, such as the maximum and/or minimum amplitude levels, from which the receiver can determine any intermediate levels by calculation. A message may be transmitted "time-spanning" by occupying successive symbol-times on a single subcarrier, or "frequency-spanning" by occupying a single symbol-time on multiple subcarriers (not to be confused with time-division duplexing TDD and frequency-division duplexing FDD which pertain to duplexing of message pairs, and have nothing to do with the shape of each message in time-frequency space). "RF" or radio-frequency refers to electromagnetic waves in the MHz (megahertz) or GHz (gigahertz) frequency ranges. The "raw" signal is the as-received waveform before separation of the quadrature branch signals, and includes a raw-signal amplitude and a raw-signal phase. "Phase noise" is random noise or time jitter that alters the overall phase of a received signal, usually without significantly affecting the overall amplitude. "Phase-noise tolerance" is a measure of how much phase alteration can be imposed on a message element without causing a demodulation fault. "Amplitude noise" includes any noise or interference that primarily affects amplitudes of received signals. A "faulted" message has at least one incorrectly demodulated message element, as-received. A "phase fault" is a message element demodulated as a state differing in phase from the intended modulation state, whereas an "amplitude fault" is a message element demodulated as a state differing in amplitude from the intended modulation state. The receiver can also combine the two QAM branch amplitudes to determine a "sum-signal", which is the vector sum of the I and Q branch signals and generally approximates the raw waveform. A vector sum is a sum of two vectors, which in this case represent the amplitudes and phases of the two orthogonal branches in I-Q space. The sum-signal has a "sum-signal amplitude", equal to the square root of the sum of the I and Q branch amplitudes squared (the "root-sum-square" of I and Q), and a "sum-signal phase", equal to the arctangent of the ratio of the I and Q signal amplitudes (plus an optional base phase, ignored herein). Thus the sum-signal represents the raw received waveform of a particular subcarrier, aside from signal processing errors in the receiver— which are generally negligible and are ignored herein.

As used herein, a "modulation deviation" is a difference between a message element's received modulation state and the closest modulation state of the modulation scheme, or alternatively the difference between the received modulation amplitude or phase and the closest predetermined amplitude or phase level of the modulation scheme. A "fluctuation" is a measure of the temporal variations (relative to an average value) of the waveform signal within a single resource element, such as fluctuations in phase or amplitude within one symbol-time. The amplitude or phase fluctuations may be due to noise or interference. The signal in each message element can be measured multiple times within each message element, and the distribution of amplitudes or phases in those measurements can represent a "width" of the fluctuation distribution and a "peak" location of the distribution, either of which can indicate which message element is faulted. To demodulate the message element, such fluctuations are generally averaged for the entire message element, and then the average value is compared to the predetermined amplitude or phase levels. The "modulation quality" is inversely related to the modulation deviation. The "signal quality" is a composite metric from the various waveform measurements, in which low signal quality indicates the likely faults. "Suspiciousness" represents an overall estimate of the probability that the message element is incorrectly demodulated, based on the waveform signal-quality analysis plus the message content analysis. In general, a faulted message element is expected to have a higher suspiciousness and lower signal quality than the non-faulted message elements, thereby enabling the receiver to identify the likely faulted message elements for mitigation. "Probable" and "likely" are used interchangeably.

How Interference Affects Waveform

Turning now to the figures, the following examples show how various waveform fluctuations can occur due to interference.

FIG. 1A is a schematic showing an exemplary embodiment of a signal waveform with and without interference, according to some embodiments. As depicted in this non-limiting example, a waveform received by a wireless receiver is depicted as a sine wave 101 with zero noise and zero interference. Also shown is a typical interference 102 (vertically offset for clarity). The interference 102 in this case has the same phase as the signal waveform 101 but a smaller amplitude. The noise or interference 102 generally adds or subtracts from the signal waveform 101, depending on factors such as antenna orientation, phase, and timing. For example, if the interference 102 is received "constructively", it adds to the signal waveform 101, resulting in an increase in amplitude as 103. If the interference 102 is received "destructively", it is subtracted from the waveform 101, resulting in the lower amplitude as 104.

Receivers generally use a narrow-band digital filter to separate each subcarrier waveform, and the digital filter admits only a narrow range of wavelengths. Digital filtering, among other signal processing, may be used to extract one subcarrier signal from an OFDM symbol that includes a large number of subcarrier signals superposed. The digital filter also selects noise or interference in the narrow subcarrier bandwidth. Alternatively, the receiver may determine the amplitudes and phases of the various subcarrier components directly from the OFDM signal, without explicitly separating the waveforms. It is immaterial how the receiver chooses to extract the waveform data from the OFDM symbol. In each case, the bandwidth of the subcarrier filter (15 kHz at the lowest numerology), suppresses features that represent frequencies significantly outside that bandwidth. Nevertheless, many signal irregularities pass the filter and can reveal each faulted message element.

Figure 1B:
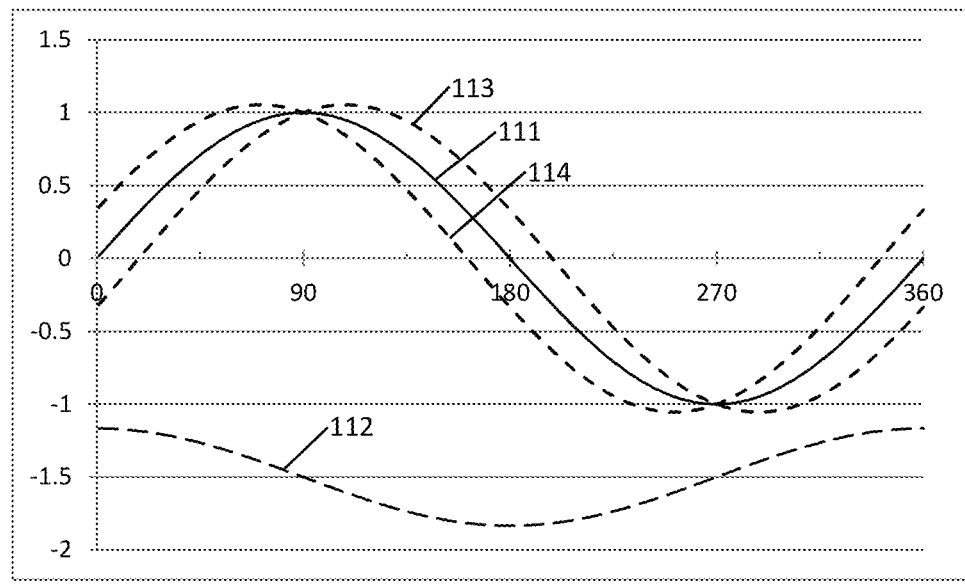
FIG. 1B is a schematic showing another exemplary embodiment of a signal waveform with and without interference, according to some embodiments.

FIG. 1B is a schematic showing another exemplary embodiment of a signal waveform with and without interference, according to some embodiments. As depicted in this non-limiting example, the noise-free signal waveform 111 is shown as in the previous figure, and now the noise or interference 112 has a 90 degree phase shift relative to the signal waveform 111. When added to the signal waveform 111, the interference 112 causes a phase shift as shown at 114. When the interference 112 is subtracted from the signal waveform 111, the combined waveform 113 has a phase advance as shown.

A receiver may incorrectly demodulate a message element that has an amplitude or phase change due to interference of the types depicted, thereby causing a fault. Therefore, the receiver can localize the faulted message element according to an unexpected amplitude or phase value, or a fluctuation or other irregularity in the amplitude or phase, of the message element's waveform.

In an OFDM symbol, each subcarrier signal is transmitted orthogonal to its neighboring subcarrier signals. Orthogonality, in this sense, means that the net overlap between two adjacent subcarrier waveforms is theoretically zero. Signal orthogonality greatly suppresses inter-subcarrier crosstalk, but only for the transmitted signal. Orthogonality does not apply to noise and interference because the noise and interference can have arbitrary phase and frequency. Many types of noise and interference generate a detectable signature on the waveform, a signature that passes the filter and can be used to identify faults. Hence one purpose of the disclosed procedures is to enable the receiver to measure the effects of noise and interference on the waveform itself, and thereby identify those message elements that have been faulted, and to correct them in real-time.

Figure 2A:
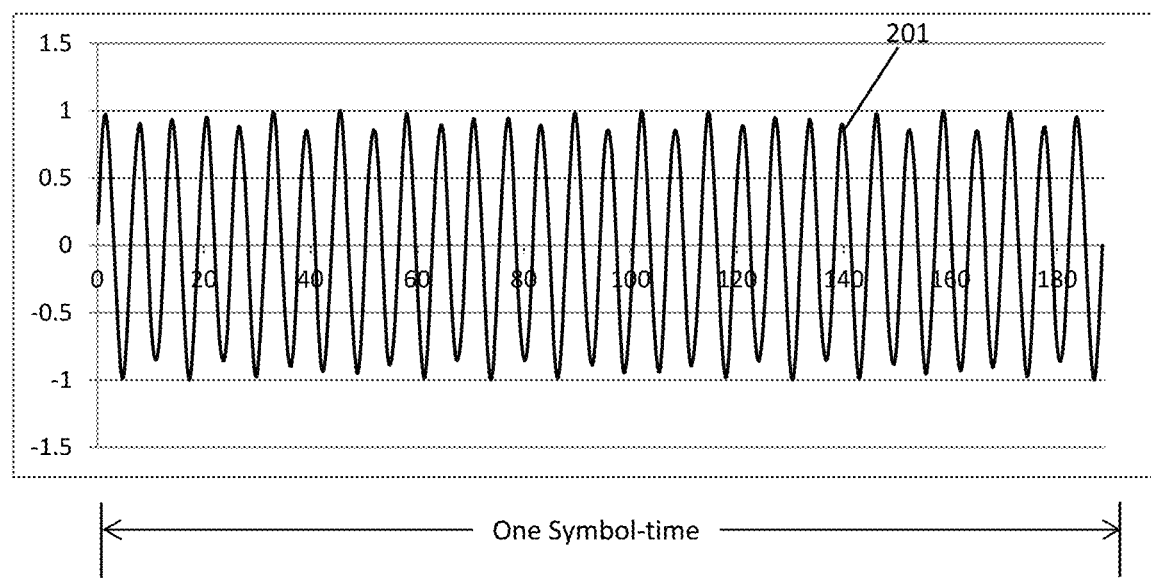
FIG. 2A is a schematic showing an exemplary embodiment of a signal waveform with minimal interference, according to some embodiments.

FIG. 2A is a schematic showing an exemplary embodiment of a signal waveform with a small amount of noise, according to some embodiments. As depicted in this non-limiting example, the waveform signal 201 of a single message element is shown schematically as a sine wave filling a symbol-time (not to scale). Some noise is superposed; hence the waveform 201 appears somewhat fluctuating in amplitude, as shown. The receiver can measure the amplitude fluctuations and determine a distribution of amplitudes, or equivalently, of the amplitude fluctuations relative to an average. The receiver can then determine an average size of the amplitude fluctuations, and can determine a corresponding width of the fluctuation distribution. Message elements that have the largest fluctuations (or the widest distribution) are likely faulted, or at least suspicious.

Figure 2B:
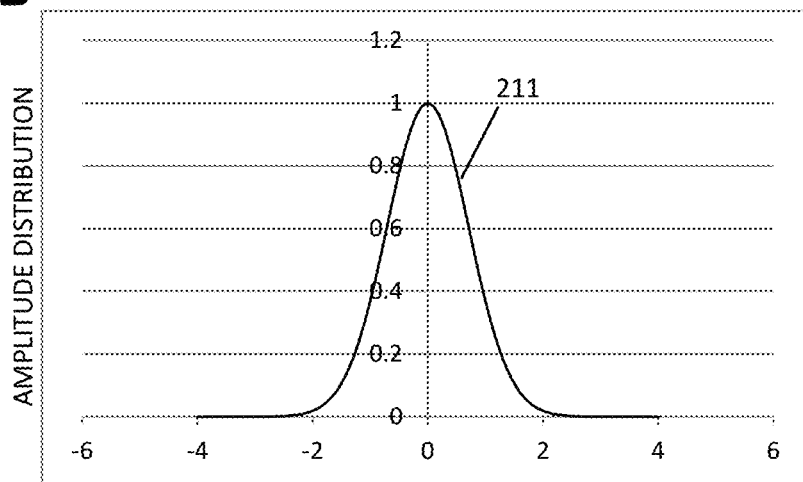
FIG. 2B is a schematic showing an exemplary embodiment of a fluctuation distribution of a waveform amplitude with minimal interference, according to some embodiments.

FIG. 2B is a schematic showing an exemplary embodiment of a fluctuation distribution of a waveform amplitude including minimal random noise, according to some embodiments. As depicted in this non-limiting example, the distribution of waveform amplitudes is plotted as 211. The distribution is zero-centered because the predetermined amplitude level of the modulation scheme has been subtracted. In the depicted case, the amplitude distribution 211 is a "normal" or "Gaussian" distribution characteristic of thermal noise or amplifier noise in the receiver. The horizontal axis is demarked in standard deviations of the Gaussian. However, in some cases (shown below) the distribution is not Gaussian, and therefore a more convenient measure of distortion may be the FWHM full-width at half-maximum of the distribution 211. Another valuable diagnostic is the peak position (or skew) of the amplitude distribution. The peak is centered in the depicted case. In other cases, depicted below, the distribution can be displaced by asymmetrical distortions. Since noise and interference tend to increase the width and/or skew of the fluctuation distribution, the receiver can identify the most likely faulted message element or elements, according to some embodiments.

Figure 3A:
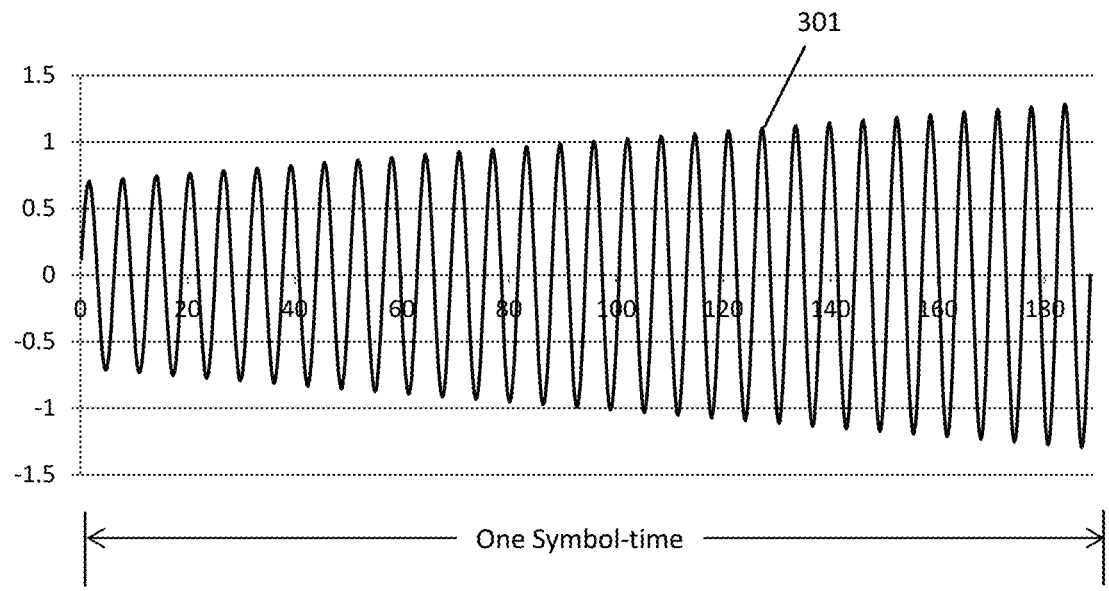
FIG. 3A is a schematic showing an exemplary embodiment of a signal waveform with rising interference, according to some embodiments.

FIG. 3A is a schematic showing an exemplary embodiment of a signal waveform with temporally rising interference, according to some embodiments. As depicted in this non-limiting example, a waveform 301 of a single message element is increasing in amplitude during the symbol-time, due to some kind of changing noise or interference. The receiver can measure the amount of amplitude fluctuation, and can determine that significant interference is present.

Figure 3B:
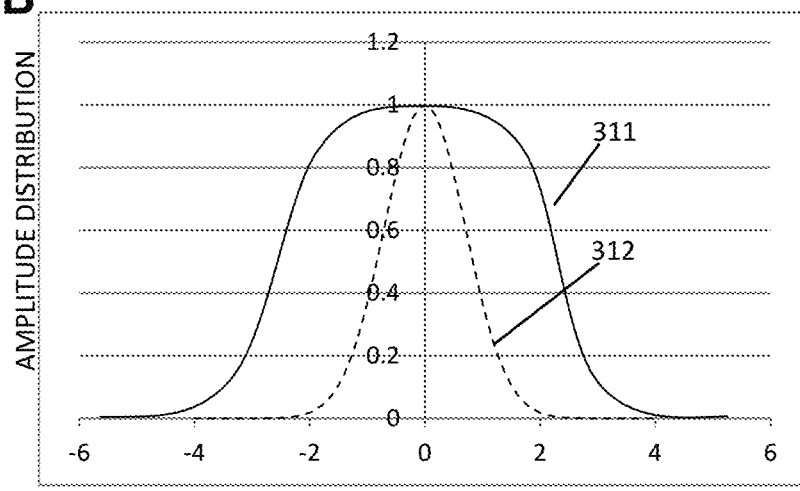
FIG. 3B is a schematic showing an exemplary embodiment of a fluctuation distribution of a waveform amplitude with rising interference, according to some embodiments.

FIG. 3B is a schematic showing an exemplary embodiment of a fluctuation distribution of a waveform amplitude with rising or falling interference, according to some embodiments. As depicted in this non-limiting example, the distribution of amplitude values observed in the received waveform 301 is shown as the solid line 311. The original low-noise Gaussian 312 is also shown in dash for comparison. As shown, the fluctuation distribution 311 is widened due to the substantial variation in amplitude during the symbol-time.

Here and below, distortions are shown exaggerated for clarity. Some of the exaggerated effects would be suppressed by the narrow-band digital filter, and some would appear in a different form in other subcarriers, but are included here for illustration purposes.

Figure 4A:
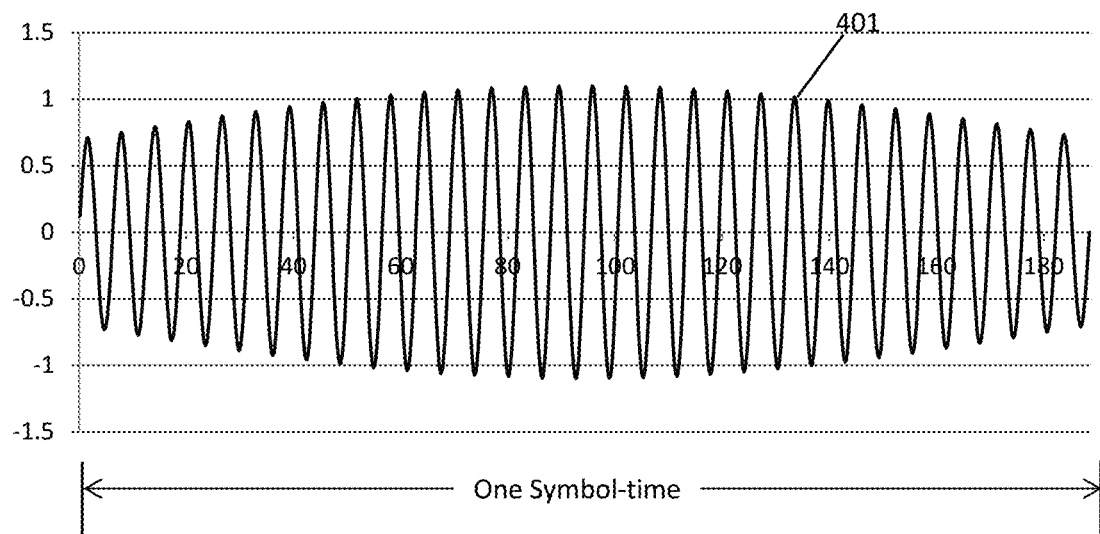
FIG. 4A is a schematic showing an exemplary embodiment of a signal waveform with peaking interference, according to some embodiments.

FIG. 4A is a schematic showing an exemplary embodiment of a signal waveform with peaking interference, according to some embodiments. As depicted in this non-limiting example, a signal waveform 401 increases and then decreases in amplitude during the symbol-time, due to time-dependent interference for example. The receiver can detect the interference according to the time-dependent amplitude, and can thereby identify suspicious message elements.

Figure 4B:
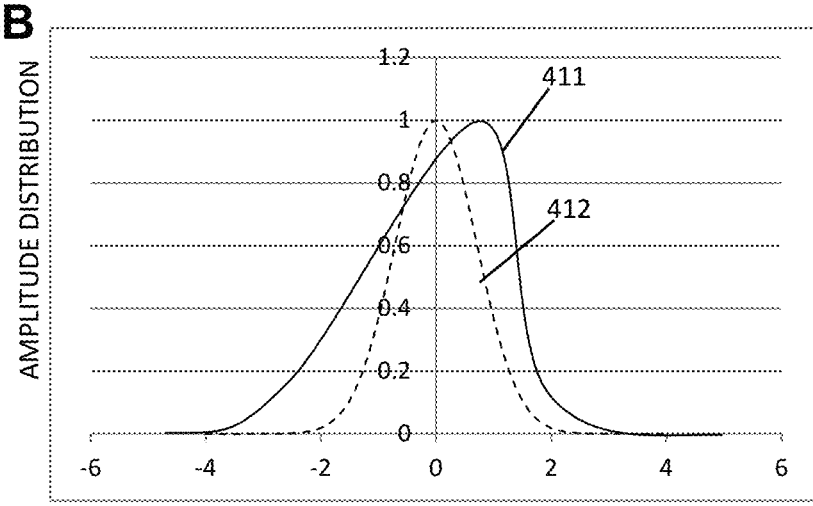
FIG. 4B is a schematic showing an exemplary embodiment of a fluctuation distribution of a waveform amplitude with peaking interference, according to some embodiments.

FIG. 4B is a schematic showing an exemplary embodiment of a fluctuation distribution of a waveform amplitude with peaking interference, according to some embodiments. As depicted in this non-limiting example, the amplitude distribution 411 for the waveform 401 is shown, skewed by the asymmetric variation of amplitudes during the amplitude changes, along with the original distribution 412. The receiver can measure the width and the peak position to determine that interference is present.

Figure 5A:
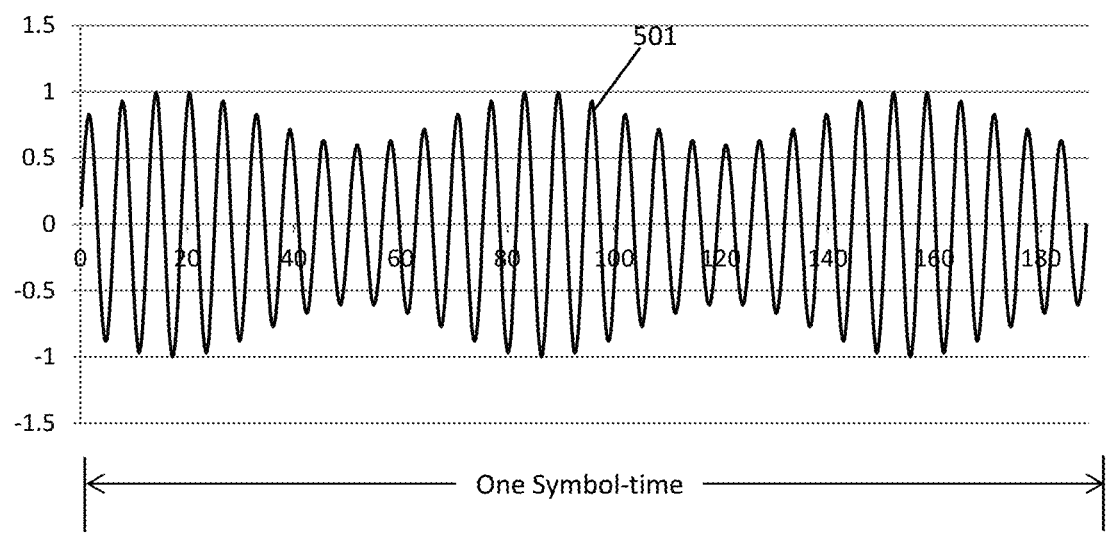
FIG. 5A is a schematic showing an exemplary embodiment of a signal waveform with frequency interference, according to some embodiments.

FIG. 5A is a schematic showing an exemplary embodiment of a signal wave with interference, according to some embodiments. As depicted in this non-limiting example, a waveform 501 is beset by strong interference at a slightly different frequency (but within the filter bandwidth), resulting in the interference pattern shown.

Figure 5B:
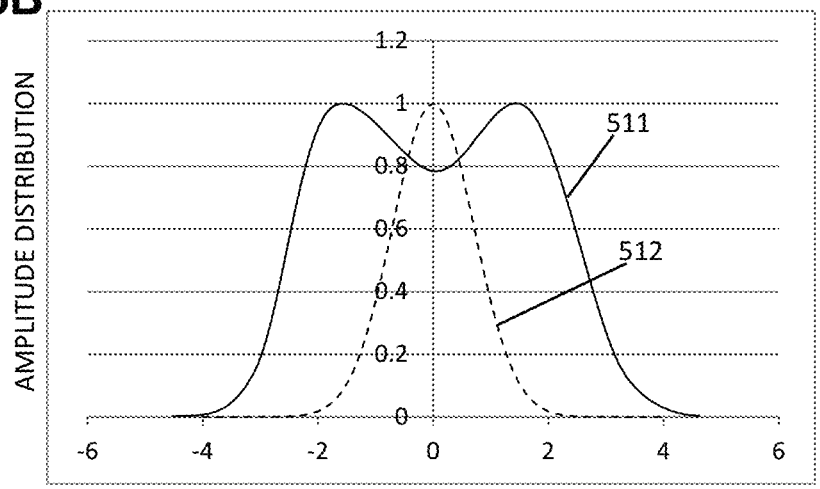
FIG. 5B is a schematic showing an exemplary embodiment of a fluctuation distribution of a waveform amplitude with frequency interference, according to some embodiments.

FIG. 5B is a schematic showing an exemplary embodiment of a fluctuation distribution of a waveform amplitude with frequency interference, according to some embodiments. As depicted in this non-limiting example, the amplitude distribution 511 is double-peaked due to the shape of the waveform 501. Most of the amplitudes in 501 are either larger or smaller than the average, while the intermediate sizes are under-represented. The receiver can detect the increased width of the amplitude distribution, relative to the expected distribution 512, and can thereby determine that severe interference is likely happening in the affected message element.

A wide variety of other amplitude fluctuations and distribution functions are possible, depending on the amplitude, phase, and temporal fluctuation of the encroaching interference. The receiver may detect the distortion either by measuring the amplitude fluctuations directly, or by determining the width of the amplitude distribution within the message element's symbol-time, or by detecting the peak position of the distribution, or other parameters of the fluctuations and/or the distribution function.

The foregoing examples deal primarily with amplitude fluctuations. Phase fluctuations can also indicate interference, and can be processed in a similar way to reveal the faulted message element, as the next example shows.

Figure 6A:
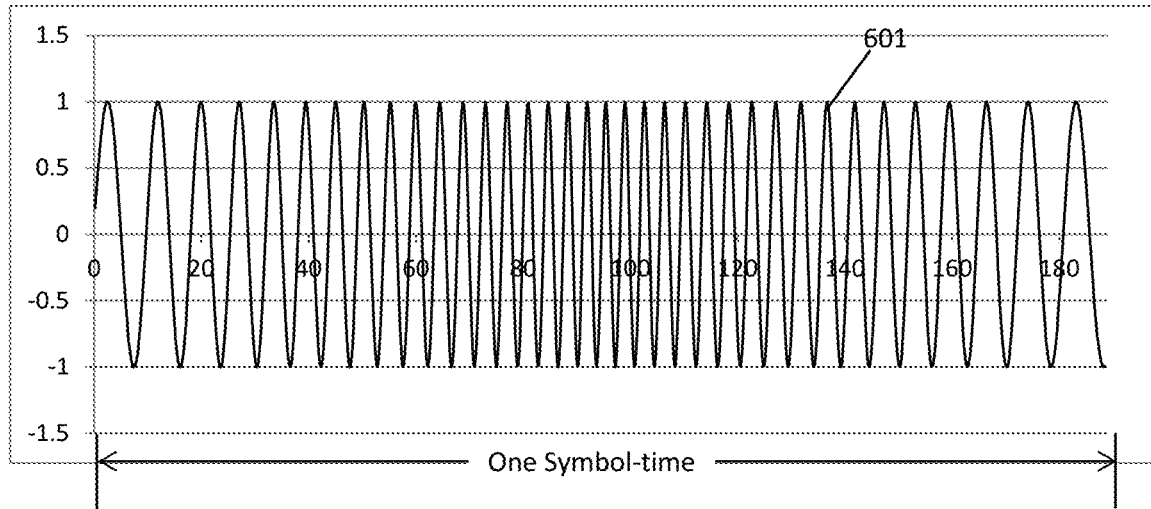
FIG. 6A is a schematic showing an exemplary embodiment of a signal waveform with phase noise, according to some embodiments.

FIG. 6A is a schematic showing an exemplary embodiment of a signal waveform with time-dependent phase noise, according to some embodiments. As depicted in this non-limiting example, a received signal waveform 601 is a sine wave with varying phase or frequency (greatly exaggerated) due to noise. A phase or frequency fluctuation due to noise or interference (such as that shown in FIG. 1B for example) may be detected in various ways. The phase fluctuation can be measured according to a varying relative phase between a local oscillator and the signal waveform 601, or by digitizing and Fourier transforming the waveform to reveal a widened spectrum, or by measuring the zero-cross times of the waveform versus time during the message element, among other possible ways.

Figure 6B:
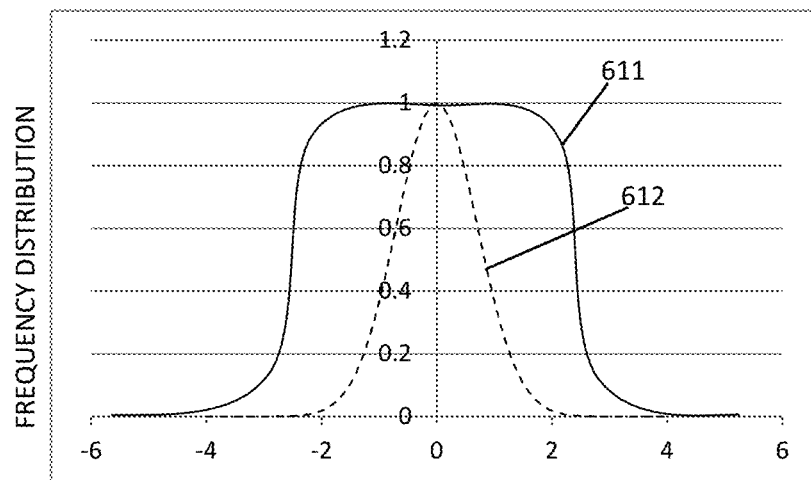
FIG. 6B is a schematic showing an exemplary embodiment of a fluctuation distribution of a waveform phase with interference, according to some embodiments.

FIG. 6B is a schematic showing an exemplary embodiment of a fluctuation distribution of a waveform phase with interference, according to some embodiments. As depicted in this non-limiting example, a distribution of phase fluctuations (or equivalently, frequency fluctuations) is shown 611 including the severe phase variations of the previous figure. For comparison, a low-noise phase distribution 612 is also shown (dash) of phases of the waveform of a message element that has normal (Gaussian) noise but no interference. The phase distribution 611 is shown truncated at both ends due to the narrow-band digital filter. The truncated energy may appear in the adjacent subcarriers. The wide distribution 611 may indicate to a receiver that phase noise or frequency interference is present, thereby rendering the message element suspicious.

The receiver can also detect a faulted message element according to a frequency offset within the subcarrier, as shown in the following example.

Figure 6C:
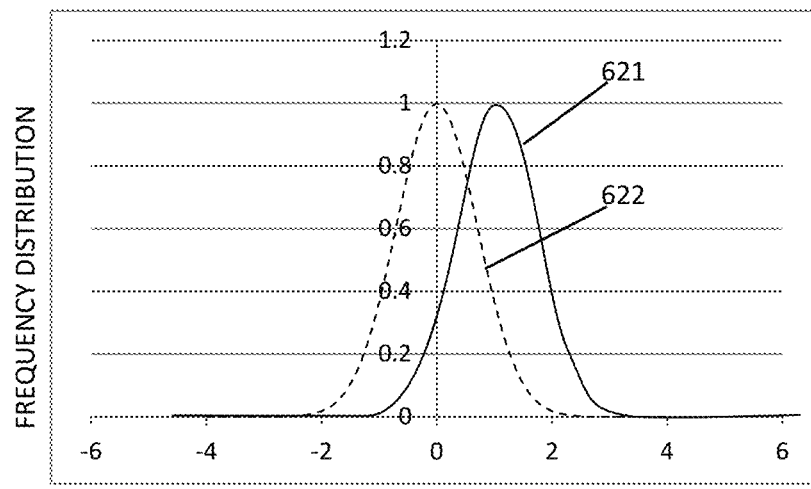
FIG. 6C is a schematic showing an exemplary embodiment of an FFT spectrum of a waveform with frequency interference, according to some embodiments.

FIG. 6C is a schematic showing an exemplary embodiment of an FFT spectrum of a waveform with frequency interference, according to some embodiments. As depicted in this non-limiting example, a frequency spectrum with a frequency offset 621 is shown along with an unshifted spectrum 622 (dash). Both spectra have low noise in this case, as indicated by the width of the shifted peak 621 which is about the same width as the low-noise peak 622. The receiver can measure the frequency offset by performing an FFT on the digitized waveform and comparing the peak center relative to the local oscillator of the receiver, and can thereby reveal the likely faulted message element. In some cases, the interference results in two spaced-apart frequency peaks, which would also indicate that the message element is suspicious. Other spectral effects are possible depending on interference, almost all of which would indicate that the affected message element is likely faulted.

Following is a different waveform diagnostic which relates to the transition region between two successive message elements. A receiver can detect a faulted message element when the waveform in a transition interval between sequential symbol-times is distorted, as shown in the following examples.

Figure 7A:
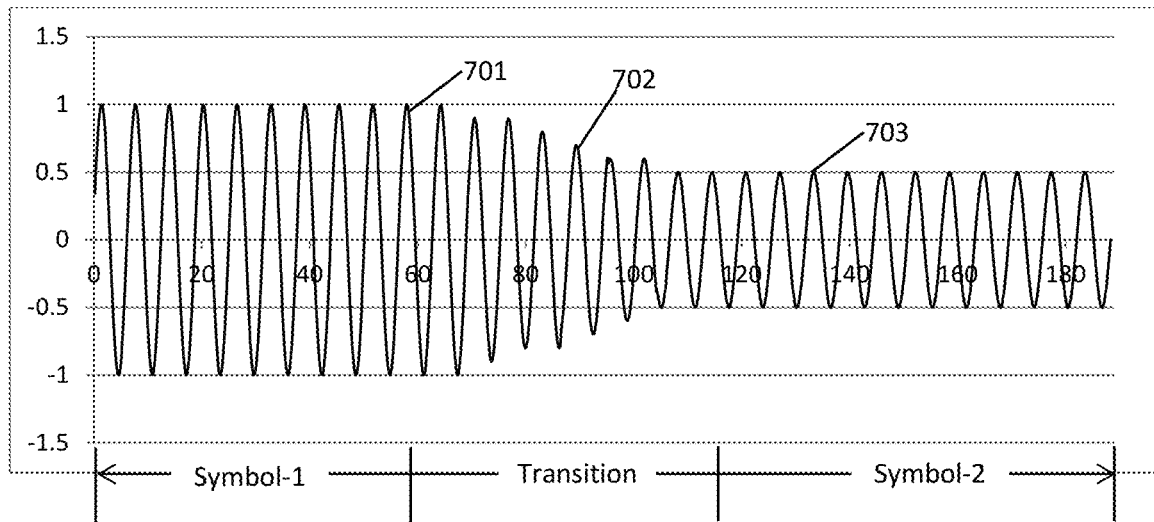
FIG. 7A is a schematic showing an exemplary embodiment of a transition between sequential symbols, according to some embodiments.

FIG. 7A is a schematic showing an exemplary embodiment of a waveform transition between sequential symbols, according to some embodiments. As depicted in this non-limiting example, a transition interval 702 is shown between the signals in two sequential symbol-times 701, 703 "symbol-1" and "symbol-2" on the same subcarrier. The transition interval 702 may represent the "ending" of symbol-1 and the "beginning" of symbol-2, or may be split between the two adjoining symbol-times. The two symbols probably belong to two different messages, because messages are usually configured frequency-spanning (occupying multiple subcarriers at a single symbol-time). Nevertheless, certain features of the transition waveform can reveal interference in each of the message elements.

The two adjacent symbol-times usually have different modulations, such as different amplitudes or phases. Therefore the transmitted signal of a particular subcarrier must transition from the first waveform 701 down to the second waveform 703 during the transition interval 702. As transmitted, the transition is generally smooth and featureless since the two symbols are at the same narrow subcarrier frequency. However, if there is external interference, the received waveform can be distorted during the time that the signal amplitude and the interfering amplitude are both changing, that is, during the transition interval. Hence the receiver can determine that one or both of the message elements are suspicious.

In this figure there is no such interference. The waveform is initially large at 701, representing the modulation of symbol-1, and then tapers into a smaller amplitude at 703, representing the modulation of symbol-2. The amplitude in the transition region 702 is featureless and monotonic (aside from the RF), thereby indicating that interference is either zero or negligible.

Figure 7B:
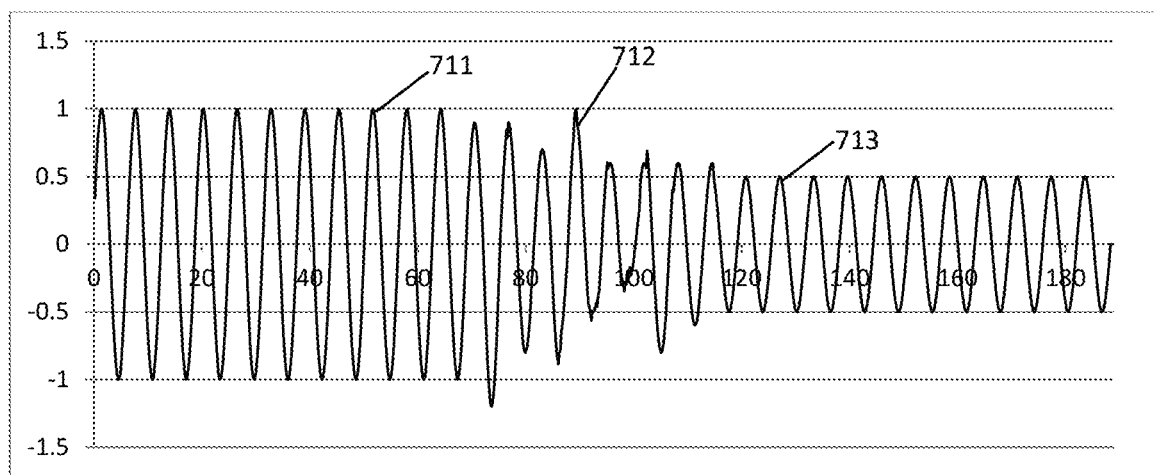
FIG. 7B is a schematic showing an exemplary embodiment of a transition between sequential symbols with interference, according to some embodiments.

FIG. 7B is a schematic showing an exemplary embodiment of a transition between temporally sequential symbols with interference, according to some embodiments. As depicted in this non-limiting example, a first symbol-time waveform 711 transitions to a second symbol-time waveform 713 on the same subcarrier, through a transition region 712. In this case, there is substantial interference which shows up primarily in the transition interval 712 as an erratic fluctuation in the amplitude. There may also be a fluctuation in phase.

An irregular transition waveform such as 712 may result from signals received from two transmitters in neighboring networks with a timing offset. The two transmitters may have displaced time-bases, or the time offset may can result from the different propagation times. Such interference may be difficult to detect during the stable waveform intervals of each message element since the interference is constant in those times. During the transition interval 712, however, the summed amplitude may vary erratically due to the two signals changing in amplitude or phase.

A receiver can detect the amplitude or phase fluctuations during the transition interval 712, and can thereby determine that either symbol-1 or symbol-2 may be faulted. For example, the receiver can determine the maximum rate of change of the amplitude, or of the phase, or of some other waveform parameter in the transition region. The smooth low-noise transition of the previous figure generally has a low rate of change (after deducting the RF component) whereas the interfered version of the present figure exhibits chaotic variations with a high rate of change. The receiver can measure the fluctuation distribution at the leading transition before symbol-1 and the trailing transition after symbol-2. In some cases, both the leading and trailing transitions, before and after each message element, are affected.

Figure 7C:
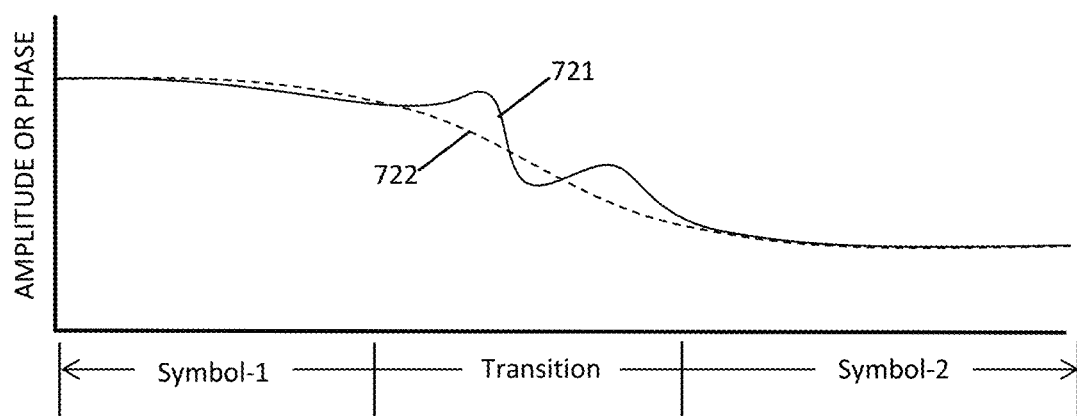
FIG. 7C is a schematic showing an exemplary embodiment of a running amplitude during a symbol transition with and without interference, according to some embodiments.

FIG. 7C is a schematic showing an exemplary embodiment of a running amplitude during an inter-symbol transition with and without interference, according to some embodiments. As depicted in this non-limiting example, a smoothed schematic (with sine wave suppressed) of an interference-free transition 722 is shown in dash, along with a strongly irregular transition 721 due to interference. Thus the smooth transition 722 may correspond to the waveform of FIG. 7A, while the noisy transition 721 may correspond to the waveform of FIG. 7B. The receiver can measure the transition variations and thereby determine whether interference is present in the adjoining message elements.

As a further detection method, a faulted message element may be identified according to an anomalous polarization due to interference, as shown in the following example.

Figure 8:
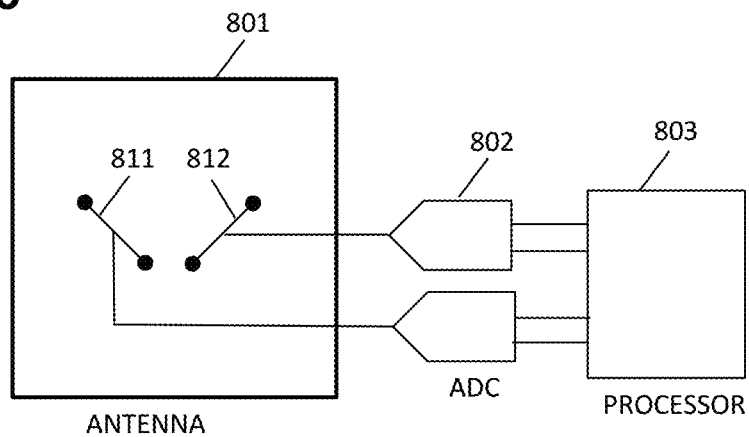
FIG. 8 is a schematic showing an exemplary embodiment of a schematic for polarization fluctuation detection, according to some embodiments.

FIG. 8 is a schematic showing an exemplary embodiment of a circuit for detecting a change in the polarization of a signal, according to some embodiments. As depicted in this non-limiting example, an antenna 801 includes two sensor elements 811, 812 oriented to detect two different electromagnetic polarizations (at ±45° in this case). The sensor elements 811, 812 are connected to two analog-to-digital converters (ADC) 802 which digitize the two polarization signals and feed them to a processor 803. The processor 803 measures the power or amplitude received in the two polarization directions and forms a ratio. An intruding signal, with different transmission or propagation history, may alter the polarization of the received waveform. Therefore the receiver can detect a faulted message element according to a ratio of the polarization components.

An additional way for a receiver to detect a fault pertains to the modulation state of the received message element, as explained in the following example.

Figure 9:
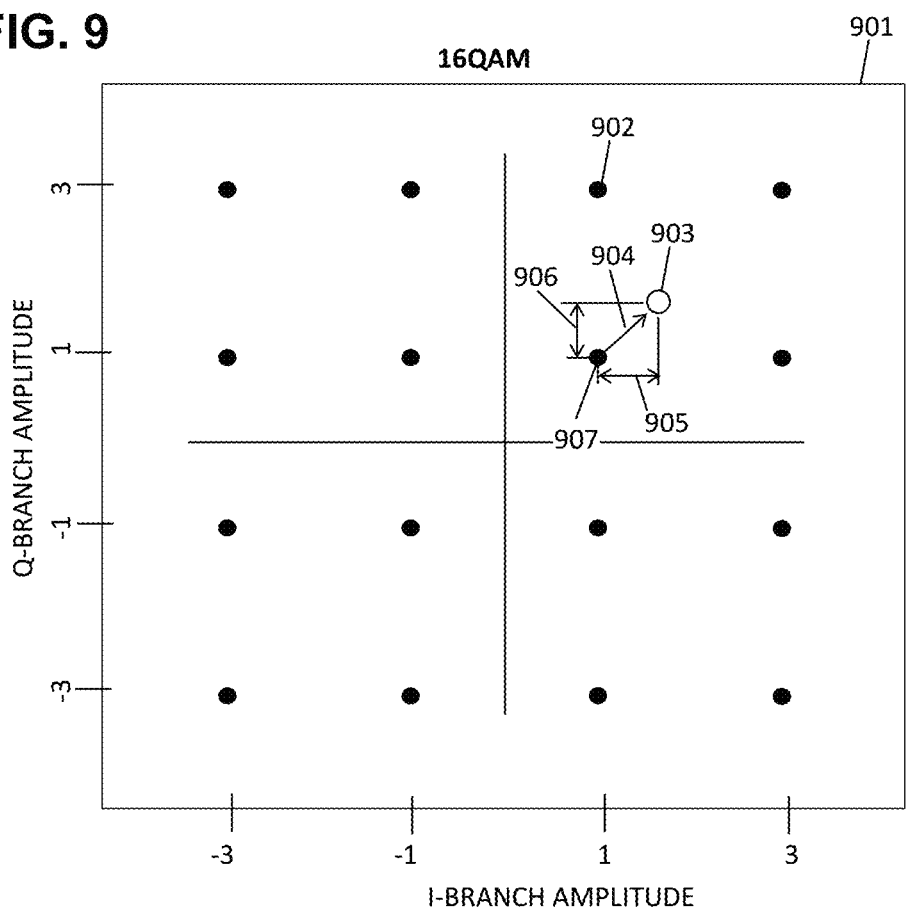
FIG. 9 is a schematic showing an exemplary embodiment of a 16QAM constellation chart including interference, according to some embodiments.

FIG. 9 is a schematic showing an exemplary embodiment of a 16QAM constellation chart, according to some embodiments. As depicted in this non-limiting example, a constellation chart 901 of 16QAM includes the 16 allowed states 902 arranged by I-branch and Q-branch amplitudes. The transmitter transmits each message element according to one of the allowed states 902, but the receiver generally receives the message element with a displaced modulation due to noise and interference. In this case, a received message element is received with the modulation shown by a circle 903, which is displaced from the as-transmitted modulation state 907. The "overall modulation deviation" is the amount of displacement 904, which equals the root-sum-square of the I-branch modulation deviation 905 and the Q-branch modulation deviation 906. Thus the receiver can localize the faulted message element according to the sizes of the branch modulation deviations 905, 906 or by the overall modulation deviation 904.

In addition, the receiver can determine a phase rotation angle for each message element, according to a ratio of the I and Q branch amplitudes. Phase fluctuations can then show up as a variation in the phase rotation angle for different message elements, and are likely largest in the faulted one.

The figure shows a QAM modulation scheme. If, instead, the message is modulated in an amplitude-phase modulation scheme, the receiver can determine the modulation deviation according to the difference in amplitude between the waveform amplitude and the nearest amplitude level of the modulation scheme, and likewise the difference in phase between the waveform phase and the nearest phase level of the modulation scheme.

The units of amplitude and phase are different, which may complicate the calculation of the overall deviation. Therefore the receiver can tally the amplitude fluctuations and the phase fluctuations separately. Alternatively, the receiver can "normalize" the amplitude deviations by dividing the difference by the level separation, that is, divide the difference between the received amplitude and the nearest predetermined amplitude level of the modulation scheme by the separation between adjacent amplitude levels. The phase difference may be normalized in the same way. Then the normalized difference values, which are unitless, can be combined or compared directly.

The modulation deviation can be determined in a similar way for other modulation schemes that involve predetermined modulation levels such as amplitude or phase levels. The modulation deviation can then be used by the AI model, generally in combination with other waveform parameters such as the amplitude and phase fluctuations of each message element, to localize the likely faulted message elements. Often the predetermined modulation levels of the modulation scheme are provided or exhibited to the receiver in a demodulation reference, which is preferably located close to or concatenated with the start of the message, and may also be embedded in the message, or included elsewhere proximate to the message. The waveform parameters of the demodulation reference can then be measured by the receiver and provided as additional input the AI model. The AI model may determine that the demodulation reference has a fault, in which case the demodulation reference may be discarded.

The AI model can calculate an overall "suspiciousness" metric, by combining the phase fluctuations, the amplitude fluctuations, the amplitude and phase modulation deviations, and any other waveform parameter that may be affected by noise or interference. Faulted message elements may be revealed by an increase in suspiciousness relative to the other message elements, since a faulted message element generally exhibits a larger fluctuation in at least one measurable parameter. The AI model can thereby localize the faults and attempt a correction without resorting to a costly retransmission.

Figure 10A:
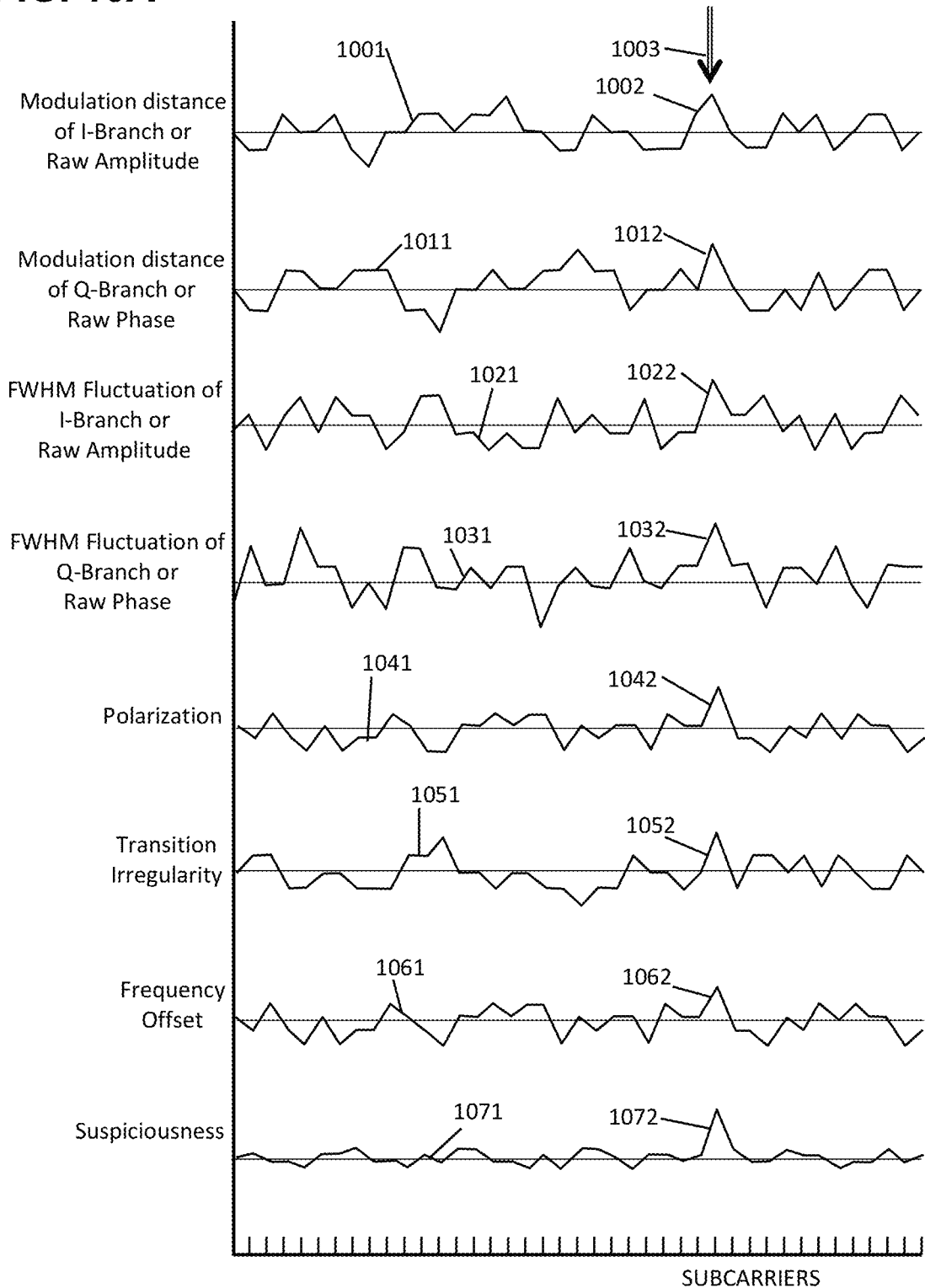
FIG. 10A is a schematic showing an exemplary embodiment of the suspiciousness parameters of the message elements in a message, according to some embodiments.

FIG. 10A is a schematic showing an exemplary embodiment of certain waveform parameters that can indicate a fault in each message element in a message, according to some embodiments. As depicted in this non-limiting example, various parameters of the waveform of each message element of the message are plotted against the horizontal axis representing the subcarriers of this frequency-spanning message. Thus the chart spans all of the message elements in the message. (As mentioned, the waveform data of the demodulation reference and the error-detection code associated with the message may be included in each item shown, so that the AI model can detect faults in the demodulation reference or the error-detection code as well as the message itself.)

The first line 1001 represents the amplitude modulation deviations of the raw amplitudes received by the message elements (if amplitude-phase modulation) or the Q-branch amplitude modulation deviations (if QAM), relative to the predetermined modulation levels of the modulation scheme. The amplitude of the waveform can be measured at multiple times within each message element, thereby determining both an average amplitude and a fluctuation distribution width, such as the FWHM of an amplitude distribution, as discussed in FIG. 2B. The first line plots the difference between the amplitude of the received message element and the closest predetermined modulation level of the modulation scheme.

A narrow-band burst of interference 1003, occupying a single subcarrier, is indicated by an arrow 1003. Accordingly, a small enhancement 1002 of the amplitude modulation deviation is present at the subcarrier of the interference.

The second line shows the modulation deviation 1011 of the phase (if amplitude-phase modulation) or the I-branch amplitude modulation deviation (if QAM). Again there is evidence of a small enhancement 1012 due to the interference 1003. A waveform phase can also be determined for QAM message elements according to a ratio of the I and Q branch amplitudes, which is geometrically related to the amplitude deviations of the two branches. For example, the QAM modulation scheme specifies a certain ratio of the branch amplitudes of each allowed modulation state, whereas phase noise causes a rotation in I-Q space which can be measured according to the ratio of the branch amplitudes. In each case, the distortion is expected to be larger, in general, for the faulted message element than for the non-faulted message elements.

The third line 1021 shows the FWHM fluctuation width of the raw waveform amplitude or the I-branch amplitude within each message element, with possibly a slight enhancement at 1022 at the interference.

The fourth line 1031 shows the FWHM phase fluctuation of the raw waveform or the Q-branch amplitude fluctuation, with again a small and unconvincing enhancement 1032 corresponding to the interference. Thus the first and second lines show the deviation relative to the predetermined modulation levels of the modulation scheme, whereas the third and fourth lines show the fluctuation width of amplitude and phase, or I and Q amplitudes, as the case may be.

The fifth line 1041 shows the polarization of the received waveform, relative to the average. Interference can cause polarization changes due to propagation differences between the interfering signals. The polarization of the received waveform can be determined in an antenna equipped with two orthogonal sensor elements, each sensor element gathering RF energy from one linear polarization only. The receiver can compare the received signals in the two sets of polarized sensors, calculate a ratio of the amplitudes of the two components, and detect a localized change in the polarization ratio, which may indicate that the message element has significant interference. As depicted, the polarization change at the faulted message element, due to the interference, is marginally noticeable at 1042.

The sixth line 1051 is a measure of the smoothness of the transition regions adjacent to the symbol-time of each message element. The transition waveform can be distorted by signals from two different sources at different distances or with different time-bases, resulting in distortions in the transition region when the amplitudes are changing, which a receiver can detect. For example, the transition between one resource element and a subsequent one at the next symbol-time, as received, is generally smooth and monotonic. The receiver, after separating the subcarrier signals in a single OFDM symbol, can determine whether the transitions are smooth and monotonic, or structured by interference or other pathology. Thus the inter-symbol transitions on one or both sides of each message element can reveal a likely faulted signal. In the depicted case, a small enhancement 1052 is shown at the faulted message element.

The seventh line 1061 indicates the frequency offset, relative to the subcarrier frequency, as measured in each message element, limited by the narrow-band digital filter. In this case, a small frequency offset indicates possible interference at 1062. The frequency offset can be quantified by calculating the Fourier transform of the digitized waveform, in which the digitization clock is controlled by the receiver's local oscillator. A small frequency offset which is uniform throughout the message is probably indicative of a local oscillator drift, not interference. However, if the frequency offset of one message element is significantly larger than the other message elements, the deviant one is likely faulted.

The last line shows the overall suspiciousness 1071, determined by combining the listed fault indicators, plus optionally other waveform diagnostics. The suspiciousness may be calculated by the AI model, combining the various test results in any way it chooses for maximum fault sensitivity. In the depicted case, although each of the individual parameters show only a relatively weak effect of the interference 1003, the enhancement 1072 in the combined metric is obvious. That is because the combining tends to average over the random small variations of the non-faulted message elements, whereas the faulted message element includes contributions from many of the separate tests, thereby enhancing the significance of the peak, more clearly indicating the fault.

The AI model may obtain further fault sensitivity by comparing each message amplitude or phase to a subset of message elements that all have the same demodulation value. This comparison, based on only those message elements that have the same modulation as the message element, is expected to provide enhanced sensitivity to faults because the equal-modulation message elements are expected to have nearly identical amplitude and phase, within small measurement errors. Therefore a fault can stand out clearly relative to the other equal-modulation message elements. Such a "like-versus-like" comparison can expose one or a few faulted message elements with high sensitivity. Interference generally causes the faulted message elements to exhibit peculiar amplitude or phase or fluctuation distribution, or some other measurable feature that differs from the other message elements that have the same modulation state. The AI model can obtain enhanced sensitivity by comparing message elements that have the same demodulation, and can thereby expose the likely faulted message elements that differ from the rest, even when the peculiar ones are within the acceptance range for demodulation and show no other error features. The fact that they differ perceptibly from their supposedly equivalent neighbors may indicate that the peculiar ones have extra noise or extra interference. Many such comparisons are possible, according to each modulation state of the modulation scheme, and according to each measurable parameter discussed above. Each of those comparisons represents another fault diagnostic and hence may be added to those shown in FIG. 10A for even greater fault sensitivity.

Figure 10B:
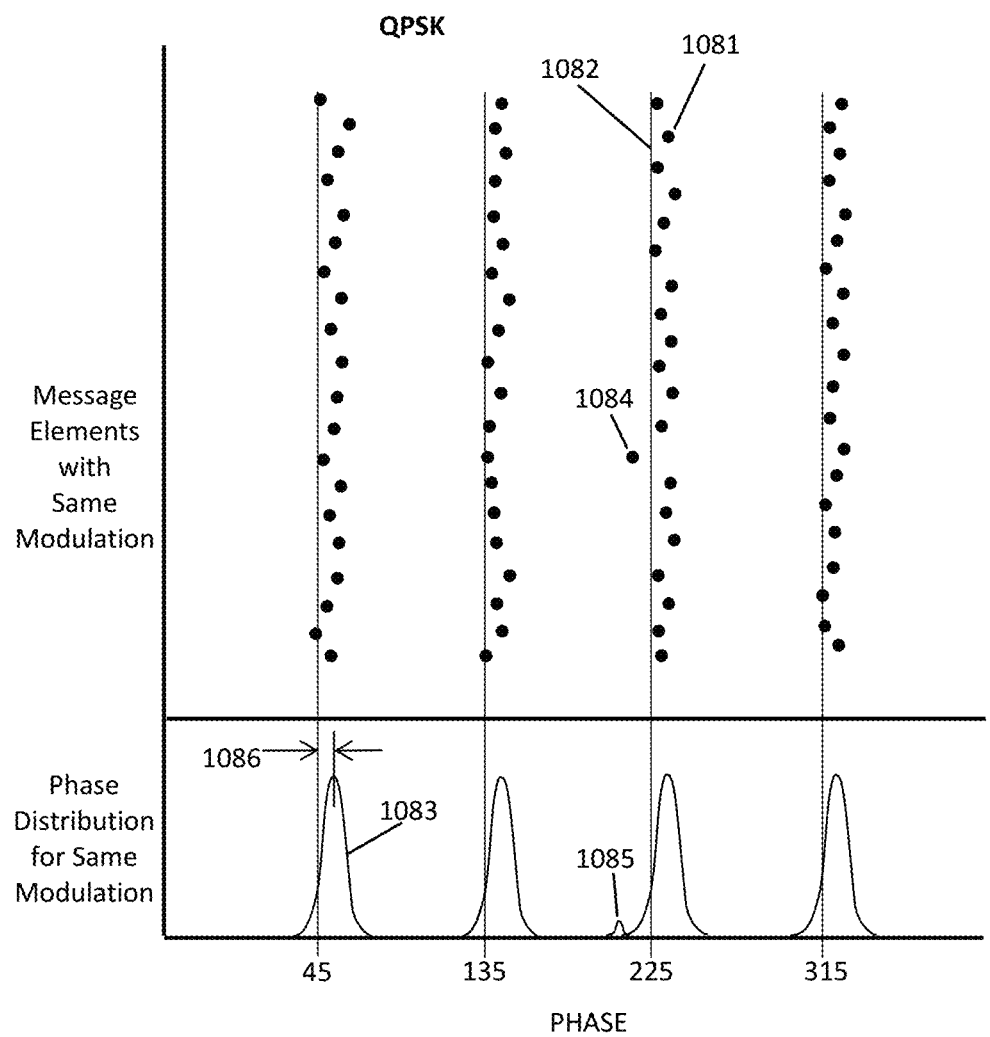
FIG. 10B is a schematic showing an exemplary embodiment of the modulation deviation of equally-modulated message elements, according to some embodiments.

FIG. 10B is a schematic showing an exemplary embodiment of the modulation deviation of equal-modulation message elements, according to some embodiments. As depicted in this non-limiting example, an AI model can compare a subset of the message elements that have the same modulation, and thereby detect a faulted outlier sensitively, since they should all have nearly identical properties. A single message element (or a few) that deviates from the average can be flagged as likely faulted. In this example, the modulation scheme is QPSK and the four phases are plotted separately. The method can apply as well to other modulation schemes such as the I and Q branch amplitudes of QAM or the raw amplitude and phase of an amplitude-phase modulation scheme, among others.

The phase of each message element is shown as a dot 1081. Since QPSK has four allowed phase levels, there are four predetermined phase levels indicated by vertical lines 1082, which represent 0-90-180-270 degrees or 45-135-225-315 degrees depending on the implementation. As expected, the various message elements 1081 cluster around the four predetermined phase levels 1082. Also shown at the bottom is the phase distribution function 1083 for each set of message elements. It may be noted that the phase distributions 1083 are all shifted by a small amount 1086 relative to the nominal phase levels of QPSK. This offset is usually due to phase noise or drift in the local oscillator, which results in the same phase shift 1086 in all of the message elements (in a single symbol-time). The phase shift 1086 is the same for all of the distribution functions 1083 because, in a frequency-spanning message, the local oscillator drift affects them all in the same way.

One of the message elements 1084 has a larger than average deviation, relative to the average phase of the set of same-modulation message elements. The peculiar modulation of message element 1084 can be seen in the point position as well as the distribution function 1085. The outlier 1084 deviates from the average phase of the equal-modulated message elements. If the message is subsequently found to be corrupted, according to the error-detection code, the outlier message element 1084 is the most likely faulted message element and may be altered first in any mitigation attempt.

Enhanced sensitivity is obtained by comparing the message elements with the same nominal phase (225 degrees in this case), thereby making the outlier 1084 visible. For even greater fault detection, the equal-modulation comparison of this example may be combined with the various diagnostic tests of the previous example.

Importantly, the outlier 1084 is revealed in this case by comparing to the ensemble average of the equal-modulation elements, not to the predetermined phase level of the modulation scheme 1082. The outlier 1084 is not far from the predetermined phase level 1082, and therefore would NOT be flagged as suspicious if the received phase were compared to the predetermined phase levels of the modulation scheme, as in the prior art. Instead, in this example, the as-received phases of the message elements are compared to the average phase of the other message elements that have the same demodulation value. If the comparison were made to the closest predetermined phase level, the outlier message element would hardly seem suspicious, since the oscillator drift 1086 largely cancels the phase deviation of this one point 1084. However, when compared to the average phase of the other message elements that have the same demodulation state, the outlier 1084, 1085 is clearly revealed.

Prior art error-correction procedures that include extrinsic information based on the modulation deviation, such as Turbo and Polar decoding procedures and certain LDPC procedures, generally fail to make this important distinction. By incorrectly comparing the as-received modulation to the predetermined modulation level of the modulation scheme, even when there is an overall shift in the as-received values, the prior-art codes generally calculate the LLR incorrectly. When there is a non-zero offset of the average, and the outlier deviation is in the opposite direction from the offset, that cancellation largely masks the actual deviation, as shown here, and therefore can result in a missed fault indicator and a failed mitigation attempt.

The following example is an alternative way of presenting the waveform measurements. The data for each message element may be charted as a histogram, as disclosed below.

Figure 11A:
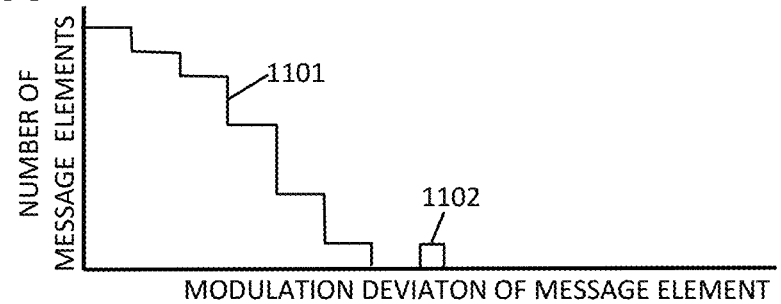
FIG. 11A is a histogram showing an exemplary embodiment of a distribution of the modulation deviation of a series of message elements, according to some embodiments.

FIG. 11A is a histogram showing an exemplary embodiment of a distribution of the modulation deviations of a series of message elements, according to some embodiments. As depicted in this non-limiting example, the histogram 1101 is a chart showing the number of message elements with each value of the modulation deviation. The modulation deviation, in this example, is the magnitude of the distance between the received modulation value and the nearest allowed modulation level, for amplitude and phase modulation levels. Most of the message elements have modulation deviations that are relatively small, which indicates that most the received message elements had low noise and thus were close to the predetermined modulation levels. However, a single message element 1102 is seen at a significantly higher modulation deviation, raising suspicion that it is faulted. Now, if the message is subsequently found to agree with its error-detection code, the outlier 1102 would be assumed to be correctly demodulated despite its large modulation deviation. But, if the message fails the error-detection test, then the message is corrupted, and at least one message element is faulted, in which case the outlier message element 1102 is the most likely suspect. The other fault diagnostics, such as the amplitude fluctuation width, the frequency offset, the polarization irregularities, and so forth can be processed in a similar way, for further fault sensitivity.

Figure 11B:
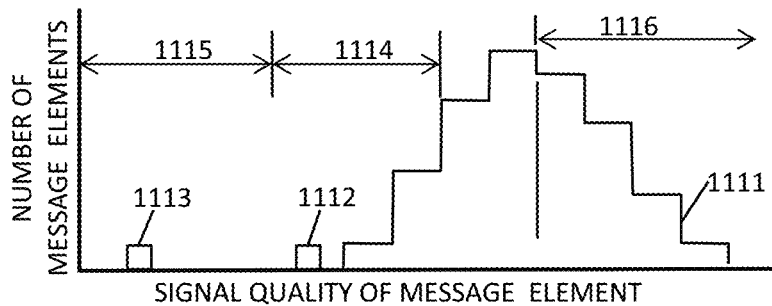
FIG. 11B is a histogram showing an exemplary embodiment of a distribution of the signal quality of a series of message elements, according to some embodiments.

FIG. 11B is a histogram showing an exemplary embodiment of a distribution of the signal quality of a series of message elements, according to some embodiments. As depicted in this non-limiting example, the signal quality of each message element is a combination of the amplitude and phase signal fluctuations (such as the FWHM width of the distribution within each message element), the peak offset of each distribution, the amplitude and phase modulation deviations (relative to the predetermined amplitude and phase levels of the modulation scheme or to an average value), an inconsistent polarization, fluctuations in the inter-symbol transition interval, a frequency offset, and possibly other contributions to the signal quality distribution.

Signal quality is opposite to suspiciousness, as used herein; smaller fluctuations correspond to higher signal quality and lower suspiciousness. In the depicted case, the distribution 1111 shows that most of the message elements have a high signal quality. In addition, two outlier message elements 1112, 1113 have substantially lower signal quality. If the message agrees with its error-detection code, then the outliers 1112, 1113 would be assumed to be correctly demodulated despite their low signal qualities. But if the message fails the error-detection test, one or both of the outliers is/are likely faulted. The AI model can then alter them to other allowed states of the modulation scheme, and thereby seek the correct message content. In addition, the AI model can exploit an error-detection code as an additional constraint, such as by calculating one of the faulted message elements explicitly from the error-detection code. In either case, the information provided by the error-detection code thereby reduces the number of alterations required to reach agreement.

Also shown are two defined ranges of signal quality 1114 and 1115. Message elements having a signal quality in the range 1114 may be allocated to a "possibly faulted" category, whereas any message elements in the lower 1115 range can be allocated to a "likely faulted" category.

Also shown is a high-quality range 1116. The message elements, or the bits of the high-quality message elements, may be "frozen" in the error-detection code since they are not suspicious. Depending on implementation, the freezing of certain message elements or bits may simplify the decoding operation by reducing the number of trials or variables that need to be processed. Only the lower-signal-quality message elements, below the high-quality range 1116, would require processing by the complex error-detection code.

Correcting a Faulted Message Element

The following examples show how the disclosed methods can be used to correct the modulation value of a faulted message element.

Figure 12:
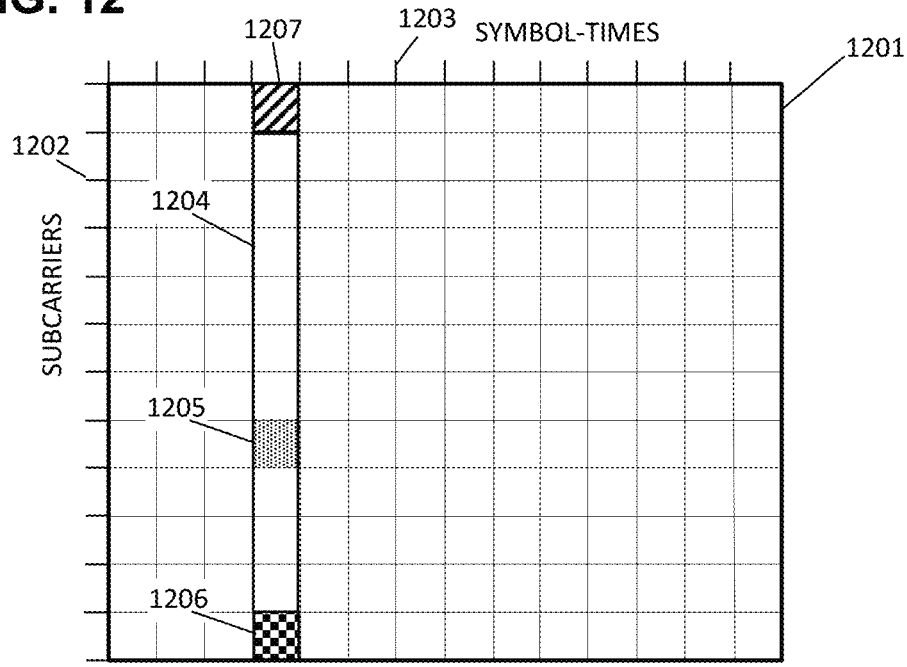
FIG. 12 is a schematic showing an exemplary embodiment of a resource grid containing a frequency-spanning message with a faulted message element, according to some embodiments.

FIG. 12 is a schematic showing an exemplary embodiment of a resource grid containing a frequency-spanning message with a faulted message element, according to some embodiments. As depicted in this non-limiting example, a resource grid 1201 is defined by subcarriers 1202 in frequency and symbol-times 1203 in time. A frequency-spanning message 1204 includes message elements in a single symbol-time, with one message element per subcarrier. As mentioned, each message element is one resource element of a message. One of the message elements 1205 (stipple) is faulted; its signal is distorted by noise or interference to the extent that its modulation state is incorrectly demodulated by the receiver.

The message 1204 may include an error-detection code 1206 (checkerboard hatch). For example, the error-detection code 1206 may be a parity construct fitting in a single resource element as shown. The error-detection code may be configured to indicate that a fault exists in the message, without attempting to localize the fault. The AI model can use the waveform fluctuations and modulation deviation values to identify the faulted message element, and can then calculate the corrected modulation of the faulted message element according to the error-correction code. Thus, as soon as the single faulted message element has been determined, the correct value can be calculated from the error-detection code. When calculated in this way, the AI model can clear the fault by a rapid and low-cost method that guarantees that the mitigated message will agree with its error-detection code. In addition, the waveform data may indicate that the fault is in the error-detection code itself, while the message elements all have high signal quality, in which case the faulty error-detection code can be ignored. A single faulted message element can be mitigated using a short parity construct 1206 as shown, without calling for a retransmission, and without bulky CRC or FEC codes.

If the message has more than one fault, the AI model can identify them according to their waveform irregularities, and can apply further mitigation based on the form and format and content and meaning of the message, as described below.

In some embodiments, the message may include two error-detection codes, one at each end of the message. The first error-detection code may be determined by the bit values in the message and in the second error-detection code, while the second error-detection code may be determined by the bit values in the message and in the first error-detection code. In this way, multiple faults can be identified according to the waveform, and can be corrected according to one error-detection code, while the success of that mitigation may be checked by the other error-detection code.

The message may include a demodulation reference 1207 (diagonal hatch). The receiver may use the demodulation reference 1207 to recalibrate the predetermined modulation levels of the modulation scheme. The demodulation reference 1207 may occupy just a single resource element, as shown. For example, the demodulation reference 1207 may be a short-form demodulation reference exhibiting the maximum and minimum predetermined amplitude levels of the modulation scheme, such as the two branch amplitudes of a QAM state, from which the other amplitude levels can be calculated by interpolation.

The AI model can determine that the message 1204 includes at least one faulted message element if the message disagrees with the error-detection code 1206. If there is no error-detection code, then the AI model can attempt to detect the fault by determining whether the message 1204 makes sense in the context it was received, or if it violates a format or other expected convention, or by another diagnostic based on the content of the message. In such cases, the signal fluctuations or the modulation deviations may indicate which message element is most likely faulted. In each case, the AI model can attempt to mitigate the fault by altering the modulation state of the most likely faulted message element and re-testing the altered message.

In the depicted example, the message 1204 includes no CRC or FEC code since the AI model can localize and correct faults based on the waveform and the brief error-detection code. In a short message, bulky prior-art error-detection codes may represent an excessive burden, whereas a short-form error-detection code occupying a single resource element may be a small price for improving the communication reliability.

In other embodiments, such as longer messages, the message may include a CRC or FEC (Turbo, Polar, LDPC, etc) code or other error code. In that case, the AI model may use the CRC or FEC code in combination with the waveform suspiciousness or signal quality determinations to cooperatively localize and rectify the faulted message element or elements. Once the faulted message element has been identified, the error-detection code may be sufficient to determine the corrected value of the faulted message element. The codes may be used by the AI model in cooperation with the waveform signal quality analysis, to accelerate the fault mitigation. Hence applications that are already committed to using CRC or FEC codes for fault detection can enhance their mitigation operations by including the waveform analysis, and may thereby rapidly localize the fault and determine the corrected value. The waveform measurements may be particularly helpful in determining whether the message is so corrupted that it is unrecoverable, as when the number of faulted message elements exceeds the maximum detection limit of the code. In addition, the waveform data can also be used to clear any ambiguities about the correct value of the faulted message elements. The waveform analysis and mitigation, coupled with CRC or FEC codes if present, can thereby repair a corrupted message, in real-time, by the receiver alone, at negligible cost, according to some embodiments.

Figure 13:
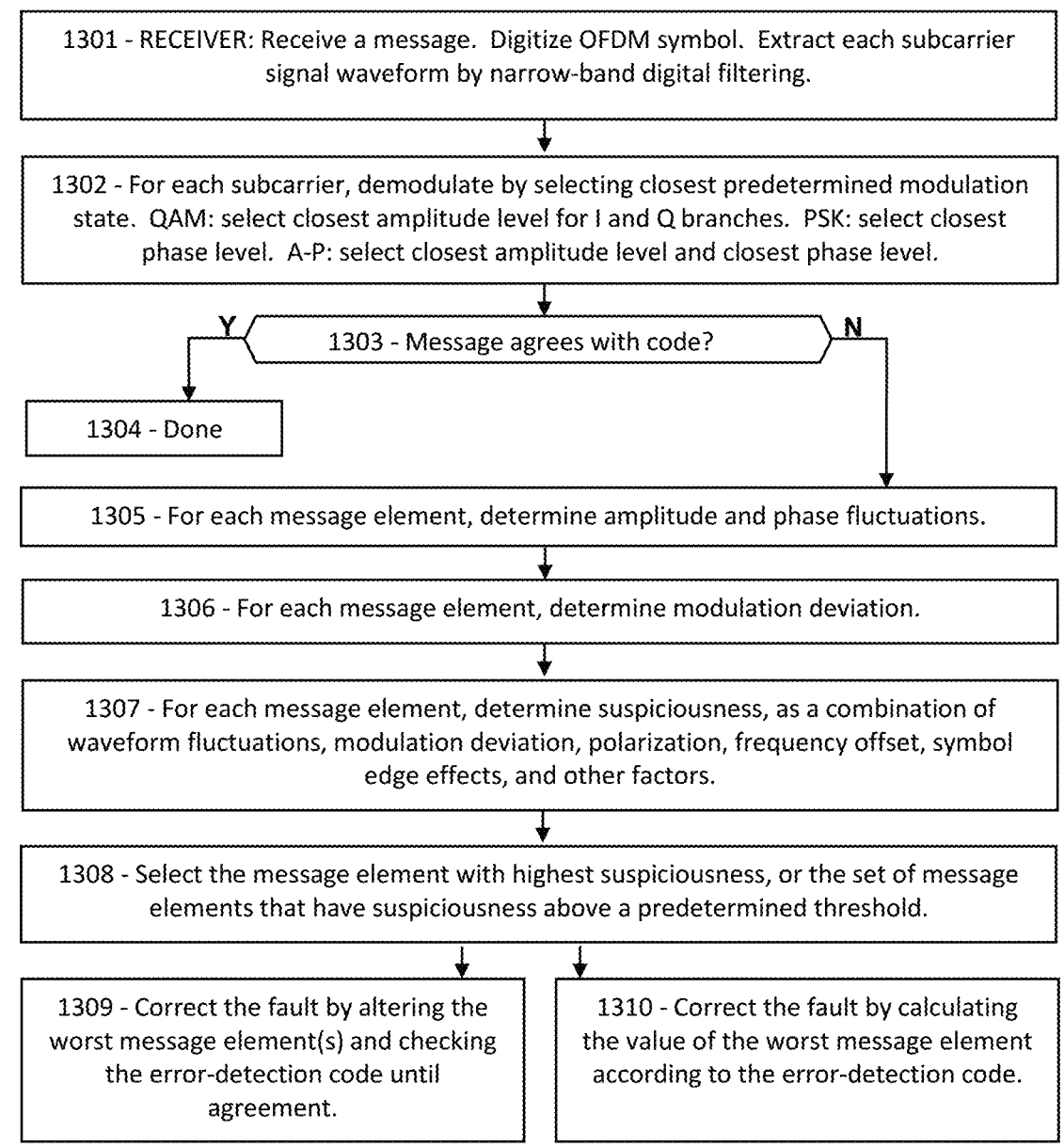
FIG. 13 is a flowchart showing an exemplary embodiment of a procedure for mitigating a faulted message element, according to some embodiments.

FIG. 13 is a flowchart showing an exemplary embodiment of a procedure for mitigating a faulted message element, according to some embodiments. The flowchart items may be executed in any order. As depicted in this non-limiting example, a receiver receives a message and, if corrupted, finds the faulted message element by waveform analysis, followed by mitigation.

At 1301, the receiver receives a message having multiple message elements, each message element modulated according to a modulation scheme involving amplitude or phase modulation or both. The message is frequency-spanning, that is, the message is included in an OFDM symbol in which multiple subcarrier signals of the message (and other simultaneous signals) appear superposed. The receiver digitizes the OFDM symbol (optionally after frequency downshifting) and extracts each subcarrier waveform by narrow-band digital filtering, thereby producing a signal waveform for each subcarrier message element.

At 1302, the receiver demodulates the message. For each subcarrier, the receiver measures the signal amplitude or phase, or other modulation parameter, and compares to a set of predetermined amplitude or phase levels, selecting the closest predetermined level. If the message is modulated in a QAM modulation scheme involving orthogonal amplitude-modulated branch signals, the receiver separates the two branches and selects the closest predetermined amplitude level for each branch. If the modulation scheme is PSK, the receiver determines the phase and compares to a set of predetermined phase levels. If the modulation scheme is amplitude-phase ("A-P") modulation, the receiver determines the amplitude and phase of the waveform and compares to predetermined amplitude and phase levels. In each case, the receiver determines the modulation state of the message element according to the closest modulation state, or the closest predetermined amplitude and phase levels, of the modulation scheme.

At 1303, the receiver calculates the demodulated message to an error-detection code, such as a CRC or FEC or parity construct, associated with the message. If there is agreement, the task is done at 1304. If not, at 1305 the receiver attempts to localize and correct the faulted message element or elements.

At 1305, the receiver analyzes the waveform of each message element. The receiver determines the fluctuation in waveform parameters, such as the fluctuation in amplitude and phase, across the symbol-time of each message element. At 1306, the receiver determines the modulation deviation, or difference between each message element's received modulation and the predetermined modulation states of the modulation scheme. The modulation deviation may be a sum or magnitude or square or other combination of distances, each distance being the difference between the received amplitude or phase or branch amplitude, and the closest predetermined amplitude or phase or branch amplitude level of the modulation scheme.

At 1307, the receiver determines a "suspiciousness" of each message element by combining the waveform fluctuations and the modulation deviations. (In another embodiment, the receiver may determine a signal quality related to the fluctuations and modulation deviations and the other listed parameters, wherein high signal quality corresponds to small fluctuations and small modulation deviations.) Other parameters may be included, such as polarization, symbol transition effects, and frequency offset of the subcarrier signal. In addition, if the error-detection code includes information about which elements are most likely to be faulted, that information can be included in the overall suspiciousness assessment. However, the procedure can also work if no error-detection code is available or if the error-detection code provides no information regarding the location of the faulted message element.

At 1308, the receiver determines the "worst" message element having the highest suspiciousness (or lowest signal quality) and presumes that the worst message element is faulted. Alternatively, the receiver can select all of the message elements that have suspiciousness above a predetermined threshold.

At 1309, the receiver can attempt to correct the fault by altering the modulation state assigned to the worst message element. For example, the receiver can alter the assigned modulation state to another one of the predetermined modulation states that is next-closest to the received modulation parameters, wherein the next-closest state is the state that is closest to the received modulation parameters other than the closest one. The receiver can then compare the altered message to the error-detection code, and thereby determine whether the altered message is correct. The receiver can proceed to alter the assigned state of the message element to each of the other allowed states in the modulation scheme, testing each version against the error-detection code. If none of the fluctuations agrees with the code, the receiver can alter the assigned states of the other message elements that have high suspiciousness, in a nested search that tests each combination of suspicious message elements at each allowed modulation state of the modulation scheme, and may thereby correct the message if possible. If none of those versions agrees with the error-correction code, the receiver can then request a retransmission, and can process the retransmitted version in the same way. If the retransmitted version is also faulted, the receiver can assemble a "merged" message by selecting, from the corresponding message elements of the two received versions, the one that has the lower suspiciousness. The receiver can test the merged message against either of the received error-detection code versions to finally mitigate the fault.

Alternatively, at 1310, the receiver can use the error-detection code to calculate the correct modulation value of the worst (most suspicious) message element, and attempt to mitigate the message. Some error-detection codes can be used to "back-calculate" the corrected value of a specific faulted message element. Thus if the message has a single fault only, the receiver may calculate it directly, without trying multiple alterations, according to the error-detection code. Some error-detection codes can back-calculate multiple faults, but these can become quite computationally burdensome.

Optionally, the receiver can count how many message elements have suspiciousness above a predetermined threshold, and if that number is above a predetermined limit, the receiver may then request a retransmission instead of embarking on a likely futile nested search through the modulation states.

In many cases, a receiver can recover the true message based on waveform suspiciousness and, if necessary, a limited number of alteration tests, thereby avoiding a costly retransmission. In many cases, the message can be recovered even in noisy environments with poor reception, using a brief parity construct. With such an error-detection code, the receiver can thereby obtain high communication reliability while avoiding the burden of FEC codes and the like.

The waveform analysis procedures disclosed herein may enable higher reliability and/or wider range of coverage by enabling the receiver to localize a faulted message element and correct it.

Figure 14:
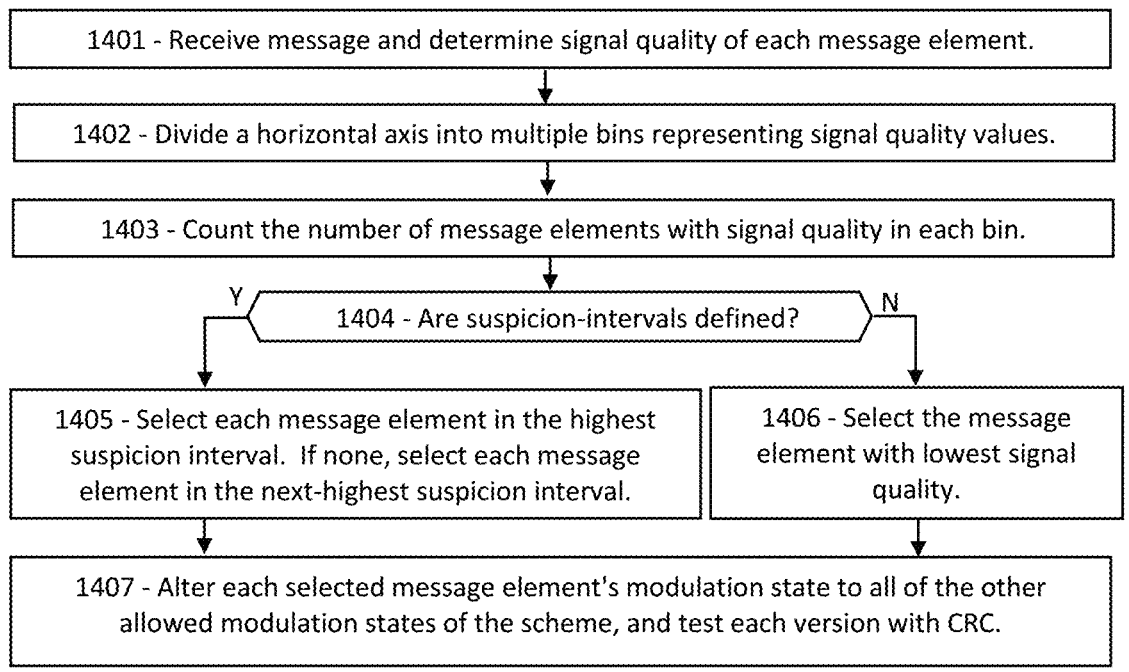
FIG. 14 is a flowchart showing an exemplary embodiment of a procedure for determining a distribution of the signal quality of each message element, according to some embodiments.

FIG. 14 is a flowchart showing an exemplary embodiment of a procedure for determining a distribution of the signal quality of each message element, according to some embodiments. The flowchart items may be executed in any order. As depicted in this non-limiting example, at 1401 a receiver can receive a message and determine the signal quality of each message element, by combining multiple diagnostic tests as indicated in FIG. 10A or FIG. 11B, for example.

At 1402, prepare the histogram by dividing the horizontal axis into a number of equal-width signal quality bins. Then at 1403, allocate each message element to the bin corresponding to its signal quality, and then count the number of message elements in each of the histogram bins.

At 1404, determine whether certain "suspicion intervals" of low signal quality have been defined. If so, at 1405 select each message element in the interval representing the lowest signal quality. If none of the message elements is in the lowest interval, select each message element in the next-lowest signal quality interval. If, however, no suspicion intervals are defined, then instead at 1406 select the one message element that has the lowest signal quality.

At 1407, alter each of the selected message elements to each of the allowed states of the modulation scheme, starting with the message element that has the lowest modulation quality. Initially alter it to the allowed state that is closest to the message element's modulation (without repeating the already-tested versions). Compare each version with the error-detection code to find the correct message content.

Alternatively, if there is just one message element with low signal quality, and therefore is likely the faulted one, and if there is an error-detection code, then the receiver may directly calculate the correct value of the faulted message element according to the error-detection code.

Signal Quality with Error Code

The foregoing examples show how the waveform data can provide fault localization and, in some cases, mitigation. The following examples show how the waveform data, combined with an error-detection code, can mitigate faults in a message even more effectively.

The fault may occur in the error-detection code itself. If so, the waveform data may expose the faulted code. The receiver may ignore the faulted code, or it may mitigate the code same as the message, or other task depending on implementation.

Every error-detection code type has a cost. Costs of current error-detection codes include the number of resource elements occupied by the code, the complexity of generating and decoding, the time and energy involved in calculation, and the latency. Every error-detection code has limits. Current error-detection codes are limited in the number of faults that can be reliably detected.

A big advantage of using signal quality information for fault mitigation, is that faults occur at the level of message elements, not at the bit level. Messages are transmitted as modulated signals representing message elements; not as bits pre se. Interference does not directly affect the bits; it directly affects the modulated signals which represent message elements. Specifically, faults occur when noise and interference alter the apparent modulation state of the message element signal, and the receiver then demodulates the faulted signals as the wrong message element. The associated bit representation is calculated later. On the other hand, most error-detection codes, including all those listed above, analyze messages at the bit level. They attempt to localize and correct flipped bits, regardless of the message signals. This disconnect between the codes and the fault process, results in high computation costs and delays. The waveform tests and related signal quality tests disclosed herein operate at the level of modulated signals such as message element waveforms, and therefore are more suited to fault mitigation in modulated signals than the bit-level codes. As shown below, embodiments that employ both waveform information and bit-level error-detection codes can mitigate faults more efficiently than either method alone, and can thereby provide substantial savings in time and costs.

For present purposes, the codes may be separated into "hard-decision" codes and "soft-decision" codes. At the receiver, hard-decision codes generally assign a binary 0 or 1 to each bit of the received message, whereas soft-decision decoding generally includes values other than 0 and 1. In the prior art, soft-decision represents the log-likelihood ratio LLR which is based on the modulation deviation. Due to noise, interference, and measurement error, the soft-decision value is never exactly 0 or 1. Processing such non-binary values may take longer than binary data, but can provide improved fault mitigation in some cases.

Basic parity, for example, is a hard-decision code with very low cost, which detects the presence of one or more bit errors but does not indicate which bit or message element is likely faulted. The waveform data, on the other hand, can indicate which message element is most likely faulted. Thus the receiver can use the basic parity code and the waveform results together, to both find and correct the faulted message element. Such a basic arrangement may be sufficient for the short messages typical of many IoT applications, and is compatible with low-cost reduced-capability processors.

CRC codes are also hard-decision, without fault localization, and involve low to moderate complexity. The resource cost is 16 bits (or 24-32 bits when higher reliability is required). Operationally, the CRC code is calculated as a remainder after the message bits are divided by a predetermined polynomial. The receiver can check the message using the CRC code in at least two ways. The receiver can recalculate the CRC code based on the received message, or it can divide the entire sequence (message plus code) by the polynomial and compare the remainder to zero. In either case, as with basic parity, the results indicate whether the message or code has been corrupted, but not which message elements are incorrectly demodulated. Hence the waveform data can augment the mitigation by indicating which message elements are likely faulted. The receiver can then attempt to mitigate the faults. For example, in a first embodiment, the receiver can perform the mitigation by sequentially replacing the likely faulted message elements with each of the allowed modulation states of the modulation scheme, and determining whether the altered message agrees with the CRC code. In a second embodiment, the receiver can perform the mitigation by calculating the corrected values of the likely faulted message elements directly from the code. Which mitigation method is less costly depends on implementation details.

Certain versions of LDPC codes are hard-decision codes involving multiple parity tests of a small number of the message elements, selected at random or according to a predetermined pattern. Faults can be eliminated by a consistency criterion. However, the fault locations are initially not known, and hence the receiver must perform a computation-intensive iterative derivation to mitigate the message. The waveform data can enhance this process by indicating the most likely faulted message elements, thereby reducing the ambiguity in localizing the fault or faults and greatly simplifying the decoding process. Alternatively, the receiver can use the waveform data to allocate the likely faulted message elements (or their bits) as "erasure" bits which have an unknown initial value, and then determine the corrected bit values according to the other bits which are linked to it. In addition, the waveform data can indicate which message elements with high signal quality can be locked, reducing the scale of the problem accordingly. By either method, the complexity is reduced and the latency is reduced when the waveform data is used cooperatively with the error-detection code.

Other versions of LDPC are soft-decision codes, by calculating the LLR of each bit, generally based on the modulation deviation. In that case, the receiver can use the waveform data to sharpen the LLR by including, as additional extrinsic information, the width of the amplitude and phase fluctuations, polarity and inter-symbol irregularities, the frequency offset, and other waveform fault diagnostics, as discussed above.

In addition, the waveform data can indicate which message elements are "trusted", that is, very likely not faulted. The receiver can then treat those trusted bits as hard-decision bits set to 1 or 0. The receiver can then focus on the remaining bits that have a lower signal quality, based on the waveform data, thereby saving time and computation. As a further enhancement, the receiver can allocate the message bits to three categories, hard-decision (1 or 0) if the waveform signal quality is above a high threshold, erasure bits (unknowns) if the signal quality is below a low threshold, and soft-decision (LLR) if the signal quality is between the low and high thresholds. The receiver may then save time by avoiding further analysis the hard-decision bits.

In addition, the receiver may save further time by attempting to correct the erasure bits first, and determining whether the resulting message version is consistent with the error-detection code. The receiver can attempt to correct the message by first adjusting the bits of message elements that have the lowest signal quality, as indicated by the waveform data. If the resulting version is still corrupted, the receiver can then proceed to correct each of the bits or message elements that have successively higher signal quality, continuing until the message agrees with the error-detection code. By either method, the receiver can thereby save time and computations by using the waveform data in cooperation with the error-detection code.

Turbo codes and Polar codes are also soft-decision codes, based on extrinsic information such as the modulation deviation. Both Turbo and Polar codes repeatedly perform consistency optimization on the initially soft message data, thereby "hardening" each bit value based on consistency with the other bits. Both codes can indicate the fault locations and their corrected values, in many cases. However, both Turbo and Polar codes require extensive complex computations by the receiver, which may be difficult for reduced-capability devices, and may be prohibitive for low-latency applications.

The receiver may use the waveform data to enhance and simplify the decoding of Polar and Turbo codes in several ways. The waveform data may be added to in the prior-art extrinsic information, thereby providing additional independent information in determining the LLR values. With the improved information about fault probability, the soft-decision values can be set closer to their eventual hard-decision 1-0 values, thereby enabling the receiver to complete the decoding process sooner and with higher success probability. In addition, as mentioned in regard to LDPC, the receiver can "freeze" the bits of the message elements that have high waveform signal quality, and thereby focus the mitigation on the remaining less-certain bits.

As a further option, the receiver can use the Turbo and Polar codes, and the soft-decision versions of LDPC, and other soft-decision codes, to calculate an overall confidence level of the final decoded message version, based on the waveform data. For example, the confidence level can be based on which message elements were found to be incorrect. For example, if a particular message solution involved a few faulted message elements and all of them had poor signal quality, then the confidence level of that message solution would be high. But if the message solution required alteration of message elements that had high signal quality, the confidence in that solution would be much lower because it seems unlikely that the corrected version would require changes in message elements that show no evidence of interference. Thus the receiver may select, as the preferred version, the one that involves altering message elements with low signal quality and avoids altering those with high signal quality.

Figure 15:
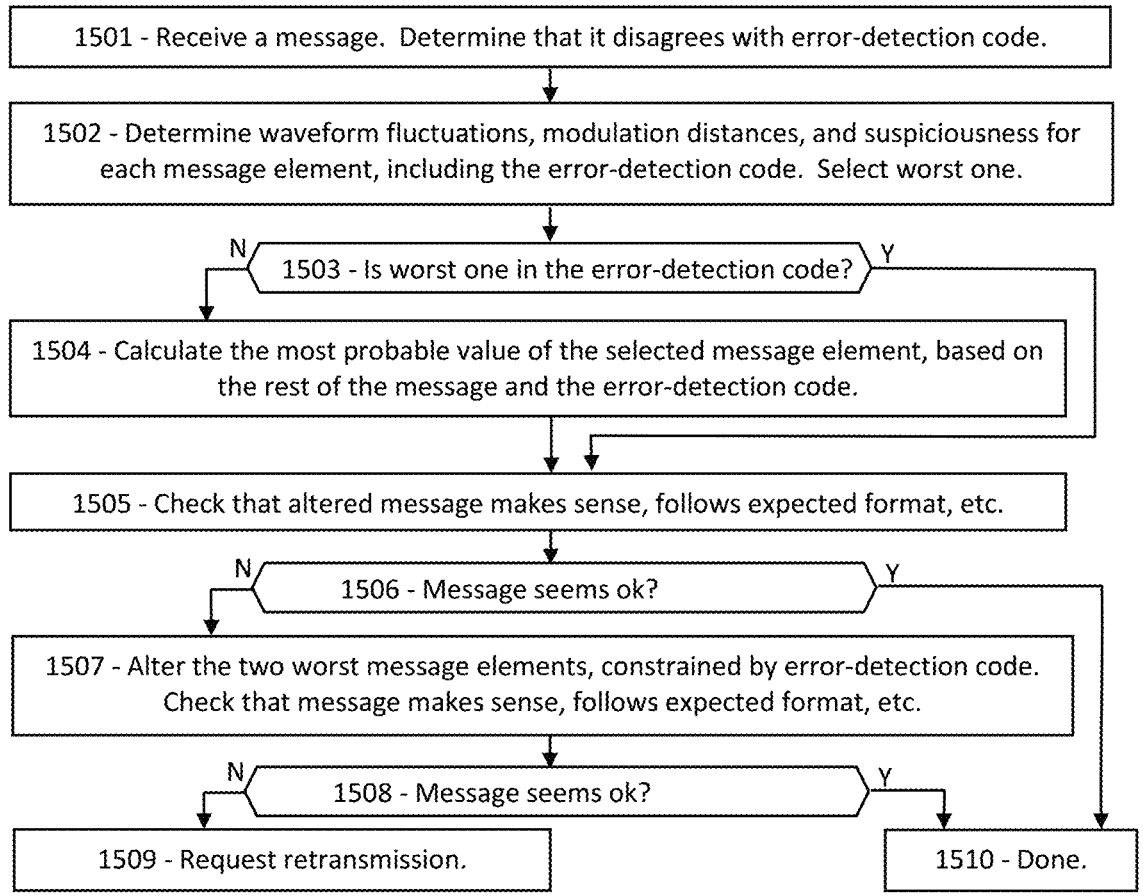
FIG. 15 is a flowchart showing an exemplary embodiment of a procedure for determining which message element is faulted, according to some embodiments.

FIG. 15 is a flowchart showing an exemplary embodiment of a procedure for determining which message element is faulted, according to some embodiments. The flowchart items may be executed in any order. As depicted in this non-limiting example, a receiver (or AI model) attempts to correct a faulted message using waveform fluctuation measurements, modulation deviations, and an associated error-detection code.

At 1501, the receiver receives the message, demodulates it, compares the message to an error-detection code (such as a CRC or Turbo or LDPC or Polar or a short-form error-detection construct) associated with the message, and determines that the message disagrees with the error-detection code, and hence there is at least one faulted message element.

At 1502, the receiver determines the waveform fluctuations, modulation deviations, and suspiciousness of each message element. The receiver then selects the "worst" message element, having the highest suspiciousness.

In evaluating the suspiciousness of the message elements, the receiver checks the signal quality of the error-detection code resource elements as well as the original message elements. That is, the receiver determines the suspiciousness of each resource element of the error-detection code, because the error-detection code may be faulted. Occasionally one of the error-detection elements may be corrupted even if the rest of the message is intact. If so, the receiver may detect the fault according to the waveform data, and may choose to ignore the error-detection code. Thus at 1503, the receiver determines whether the worst message element is in the error-detection code. If so, then the error-detection code cannot be trusted, and the flow proceeds to 1505 below.

However, if the worst message element is not part of the error-detection code, then the worst message element must be somewhere in the rest of the message, and the error-detection code may be assumed to be correct. Therefore at 1504 the receiver calculates the correct value of the worst message element according to the error-detection code. With some codes, the receiver can subtract the values of the other message elements, other than the worst one, from the error-detection code, thereby determining the correct value of the worst message element. With other error-detection codes, involving a more complicated function of the message data, the receiver can sequentially replace the worst message element with each of the legal modulation states, checking each version against the error-detection code, and thereby determine the correct value of the worst message element in some cases. Thus with the error-detection code, the receiver can rapidly determine the correct value of the single faulted message element if the location is known.

At 1505, after deriving one or more candidate solutions, the receiver checks the content of the message solution to ensure that it makes sense in the context of the relevant application, follows expected forms and formats, has no parameters out of range, and other logical tests to reveal remaining errors. If at 1506 the message passes these tests ("seems ok") then the task is done at 1510. If not, then the receiver can attempt to reconstruct the message by altering the two worst message elements as follows.

At 1507, the receiver determines which two message elements are the worst two, having the highest suspiciousness. The receiver then sequentially alters the modulation state of one of the worst two, and calculates the value of the other one according to the error-detection code, as described above. The receiver then checks that the content, format, and so forth are as expected at 1508. If exactly one of the alterations produces a satisfactory version (compliant with expected type and format and other logical tests), the task is done at 1510. If none of the alterations produces a satisfactory version of the message by these criteria, or if two of the versions are equally satisfactory, then the mitigation is ambiguous, in which case the receiver requests a retransmission of the message at 1509.

Thus the receiver has attempted to correct the message by deriving the value of the most likely faulted message element according to the error-detection code, and if that fails, the receiver alters the modulation state of the two message elements with the highest suspiciousness while applying the error-detection constraint. In addition, the receiver has applied a series of logical tests on the altered message to determine whether the fault mitigation was successful. This strategy may save substantial time and resources while enhancing communication range and reliability, even with fading propagation and noisy electromagnetic environments.

FIG. 16 is a flowchart showing an exemplary embodiment of a procedure for mitigating a message according to a hard-decision code and waveform data, according to some embodiments. The flowchart items may be executed in any order. As depicted in this non-limiting example, at 1601 a receiver receives a wireless message and determines, according to an associated error-detection code, that the message is corrupted. The error-detection code in this case is one of the hard-decision types such as basic parity, CRC, or LDPC.

At 1602, the receiver determines the waveform parameters related to signal quality of each message element, such as the amplitude fluctuation distribution, the phase fluctuation distribution, the frequency offset, the polarization, and the inter-symbol transition. Based on a combination of the waveform measurements, the receiver (or the AI model) selects the worst one and a second-worst one. (Alternatively, the receiver can determine all of the message elements that have signal qualities below a predetermined threshold.)

At 1603, the receiver determines whether the error-detection code is capable of back-calculation (that is, can it determine the correct value of a particular message bit, or the correct modulation state of a particular message element).

If not, at 1604 the receiver attempts to find the correct modulation state of the worst message element by successively replacing the worst message element with each of the legal modulation states and testing each version with the error-detection code at 1605. The double-ended arrow (here and elsewhere) indicates that the two steps are performed repeatedly until either an agreement is reached or all of the legal modulation states have been tried.

At 1605, the receiver checks each of the variations for agreement with the error-detection code, and if so, the task is done at 1608. If not, the receiver tries another modulation state at 1604.

At 1606, the receiver has tried all of the modulation states in place of the worst message element, without success. Therefore, the receiver now tries a nested grid search involving the worst and the second-worst message elements together.

At 1607, the receiver tests each of the double-replacement versions against the error-detection code, and if any version agrees, the task is done at 1608. If all combinations fail, it requests a retransmission at 1609.

Returning to 1603, if the error-detection code is capable of back-calculation, then at 1611 the receiver tries to calculate the correct value of the worst message element using the error-detection code. If the resulting message version agrees with the error-detection code at 1612, the task is done at 1616.

If not, at 1614 the receiver then successively replaces the second-worst message element with each of the legal states, and then re-calculates the expected value of the worst message element according to the error-detection code. Each version is then tested at 1615, and if successful the task is done at 1616.

If none of the replacements results in agreement, the receiver requests a retransmission at 1617. In other embodiments, the receiver may try a nested grid search with the three worst message elements, in which two of them are selected sequentially across all of the legal modulation states, while the third one is back-calculated according to the error-detection code.

Optionally, at 1618 after achieving a successful agreement with the error-detection code, the receiver may perform a "reasonableness" test of the resulting message version, based on the content of the message. For example, the receiver can check whether the putative corrected message obeys the expected format, stays within accepted limits of parameters, has a meaning or intent consistent with the associated application, and whether the message is of the expected type, among other content-based tests.

Figure 17:
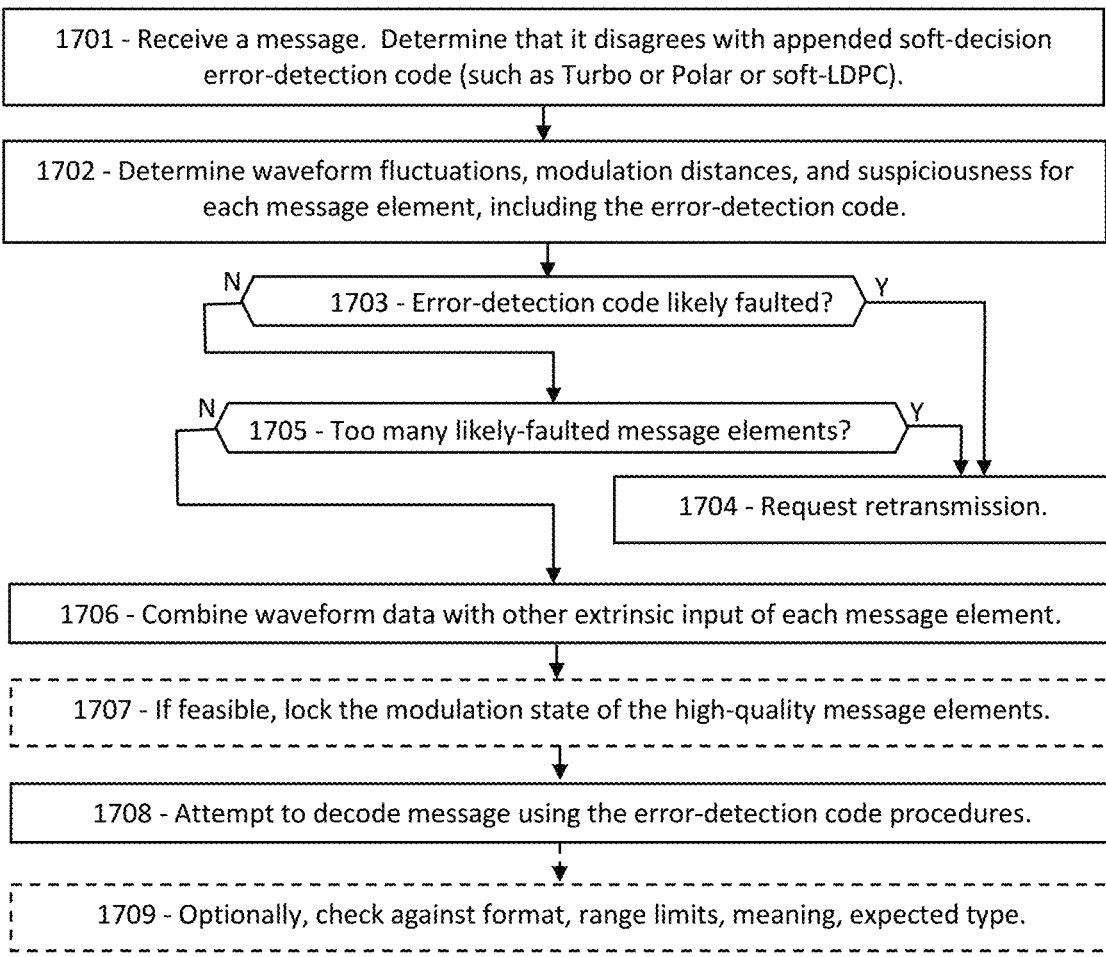
FIG. 17 is a flowchart showing an exemplary embodiment of a procedure for mitigating a message according to a soft-decision code and waveform data, according to some embodiments.

FIG. 17 is a flowchart showing an exemplary embodiment of a procedure for mitigating a message using a soft-decision code and waveform data, according to some embodiments. The flowchart items may be executed in any order. As depicted in this non-limiting example, at 1701 a receiver receives a message and determines, according to an appended error-detection code, that the message is corrupted. The error-detection code in this example is a type that incorporates soft-decision based in part on extrinsic information, such as the modulation deviation. For example, the code may be a Turbo or Polar code, or an LDPC code including soft-decision, among others. Generally these codes can determine whether the message is corrupted, and can indicate the locations of the faults at the bit level, and can indicate the corrected values (as long as the total number of faulted bits is below a maximum limit) but at substantial cost.

At 1702, the receiver analyzes the waveform data to measure the amplitude fluctuations and phase fluctuations (or the widths of the corresponding distribution functions), irregularities in polarization or inter-symbol transitions, and a possible frequency offset of each message element, as an indicator of interference. Importantly, the waveform analysis includes the error-detection code signals as well as the message signals, so that corrupted error-detection codes can be intercepted early.

At 1703, the receiver determines, based on the waveform data, whether the error-detection code includes any likely-faulted message elements, and if so, requests a retransmission at 1704.

The receiver also checks, at 1705, whether the number of likely-faulted message elements exceeds a predetermined limit, such as the maximum repair capacity of the error-detection code, and if so, requests a retransmission.

If the error-detection code does not have likely faults, and if the number of likely faulted message elements is below the limit, then at 1706 the receiver (or the AI model) combines the waveform data and the other extrinsic data of each message element, to form a more complete determination of the LLR of each message element and its associated bits.

Optionally, at 1707, the receiver may lock certain message element values that have very high signal quality according to the waveform data. Those locked message elements may be held constant at their demodulated values while the error-detection code proceeds to analyze and mitigate the other, less-high-quality message elements. Locking the best ones may save time and computations.

At 1708, the receiver may then run the decoding procedures of the error-detection code, and thereby attempt to decode the message.

Finally, at 1709, the receiver may check the decoded and mitigated message by determining a confidence level according to the content of the message, such as the format used, the type as expected, legal parameter ranges within limits, and the meaning or intent of the message relative to the context or the previous similar messages of the receiver. Such a logical content-based review of the mitigated message may enable the receiver to catch improperly decoded messages.

Artificial Intelligence Waveform Analysis

A well-trained AI model can enhance the signal quality evaluation based on measurements of the waveform of each message element. For example, AI can sharpen the determination of the amplitude and phase fluctuation distributions, and can enhance the selection of the most likely faulted message elements, and can manage the selection and confirmation of the corrected message elements according to codes and logical tests. Often the waveform distribution function of each faulted message element differs subtly from the non-faulted message elements. A receiver sensitized to the fluctuation distribution can sharpen the distinction by correlating multiple tests, and thereby detect the fault locations.

The AI model can also sharpen the other waveform-based tests, such as the modulation deviation, the polarization ratio, the frequency offset, and symbol transition irregularities, by discerning subtle inconsistencies. Likely there are other waveform parameters or correlations that the AI model can discover for identifying the fault location, correlations that may never be known to humans due to the complexity, but which can be exploited by a properly trained AI model for fault localization.

The AI model can also manage the correlation of the multiple waveform measurements. Often a small irregularity appears in various waveform tests, but it only becomes a significant fault indicator when all of the measurements are combined in a manner that the AI model can develop. Thus by developing correlations and relationships among the various waveform measurements, the AI model can localize a faulted message element even when the overall data is highly noisy.

AI can also assist by checking proper form and format which are generally constrained by the type of the message. The AI model can also analyze the content and meaning of the message, and can thereby assess whether the message makes sense in the context of the application. For example, the AI model can determine whether the message has been garbled or is somehow illegal or otherwise unexpected, based on context or rules or format or out-of-range values, for example, or more complex correlations and patterns that humans may not have previously discerned.

The AI model may analyze the intent or meaning of the message, and use that information as a fault diagnostic. For example, the AI model may interpret the intent of the message, based on its type, and detect an inconsistent message element based on the expected meaning. If multiple candidate meanings are possible, the AI model can calculate the likelihood of each candidate message version, and thereby determine the overall fault likelihood of each message element in each candidate message version.

The AI model may also use historical data, such as prior messages received by the current receiver, or prior commonly received bit sequences, or other patterns of message elements, to detect a fault. For example, the AI model can be trained using numerous prior unfaulted messages to this receiver, or other receivers in similar context, and can compare the faulted message elements to the prior ones to find a likely fault location. The AI model can compile a list of message element sequences or bit sequences that frequently occur in messages to the receiver, and a second list of bit sequences or message elements sequences that seldom occur. By comparing the bit sequences or message element sequences of an incoming message to those lists, the AI model may reveal an unusual sequence that indicates likely faulting.

When properly configured and trained, the AI model can detect subtle correlations between the various test results, correlations that may be invisible to even an expert human investigator. The AI model can then exploit those correlations to optimize the validity of the final mitigation selection, and thereby rescue a corrupted message without the delays and costs of a retransmission.

The AI model may provide, as output, a matrix of probability values, in which each probability value is the probability that a particular message element is correctly demodulated according to a particular modulation state. The matrix thus includes all of the message elements of the message on one axis, and all of the modulation states of the modulation scheme on the other axis, and each probability value is the probability that the message element has the corresponding modulation state. The probability values may be based on the waveform tests and other inputs. The AI model may impose consistency on the probability values, so that each message element's sum of probability values, across all of the candidate message versions, is no greater than 1.0. The sum of probability values, for a particular message element, may be less than 1.0 due to severe distortion. Such a finding may reveal the faulted message element. Alternatively, the message element may have two or more probability values corresponding to two or more different modulation states, which also indicates interference. The AI model may then localize the likely faulted message elements and can also select between multiple possible corrections according to the probability values of the faulted message element or elements.

The following examples show how an AI model can assist the waveform analysis, fault localization, and message recovery in real-time.

Figure 18:
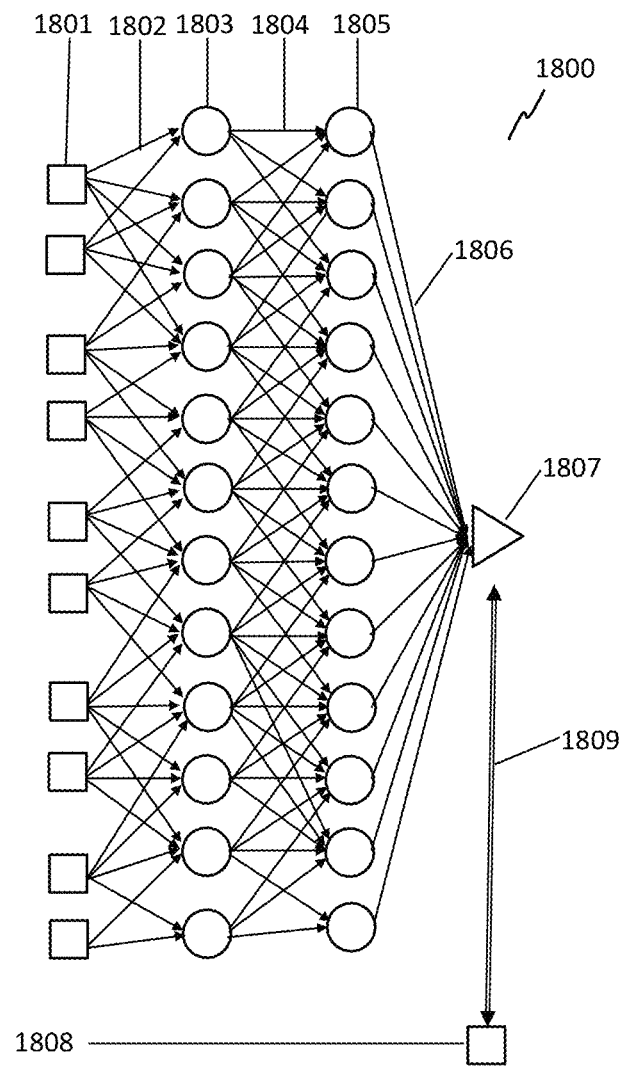
FIG. 18 is a schematic showing an exemplary embodiment of a neural net artificial intelligence model, according to some embodiments.

FIG. 18 is a schematic showing an exemplary embodiment of a neural net artificial intelligence model, according to some embodiments. As depicted in this non-limiting example, an AI structure 1800, depicted here as a neural net, has a number of inputs 1801, one or more intermediate layers of internal functions 1803, 1805 and one or more outputs 1807. The internal functions 1803, 1805 are operationally connected to the inputs 1801 and each other by links 1802, 1804, while the output 1807 is connected to the last layer of the internal functions 1606 by further links 1806. Although links are shown connecting only a few of the internal functions, in many AI structures each input and each internal function is linked to all of the internal functions of the succeeding layer. All of the links are unidirectional in this case; other embodiments include links going backwards and other complex topologies, although doing so can inhibit convergence.

The AI structure 1800 is turned into an AI "model" by adjusting numerous adjustable variables in the internal functions 1803, 1805. In some embodiments, the links 1802, 1804, 1806 can also include adjustable variables, while others are simple transfer links. The internal functions can include any type of calculation or logic relating the internal function's input link values to its output link values. In some embodiments, all of the output link values of a particular internal function are identical, while in other embodiments each link can have a different value and a different relation to that internal function's input link values.

The adjusting or "tuning" or "training" of the adjustable variables is generally performed using data related to the problem that the AI model is intended to solve. For example, if the AI model is intended to determine whether a particular message element is faulted, the data may include waveform amplitudes and phases, the width of amplitude fluctuations and phase fluctuations, modulation deviations relative to predetermined levels, the polarization of each message element, the frequency offset relative to the subcarrier frequency, the rate of change of modulation during a transition interval between symbols, among other waveform features. Further inputs may include the independently measured noise and interference levels, a demodulation reference proximate to the message, an error-detection code such as a CRC or Turbo or parity or other code if present, and the like. The inputs may further include specifications such as the required format and value limits for the type of message received, among other governing rules. Further inputs may include historical records such as a compendium of previously received messages of this type, or a digest of previously received messages by the present receiver, or a table of commonly seen bit sequences or character sequences (or a table of improbable bit sequences or character sequences) for the current message type and receiver, among other historical data. The inputs may further include the context of the message, such as the application and its tasks, the QoS or other measure of the receiver's expectations, including data that may assist the AI model in interpreting the meaning (or the intended meaning) of the message.

The resulting output 1807 may be a probability that each message element is faulted. The outputs 1807 may further include an uncertainty in the determination of the fault probability of each message element. The outputs may further include a suggestion of the corrected value of each of the message elements that were determined as likely faulted. The outputs may further include uncertainty estimates for each of the suggested corrections, for each of the presumed faulted message elements.

In cases where more than one meaning or intent can be assigned to the message, the AI model may calculate a likelihood for each meaning or intent, based on the context, or on historical records of common or uncommon interpretations, or on the number of message elements that must be altered to match each of the interpretations, or other criteria for estimating the probability that each of the different interpretations is the correct one. In addition, the outputs may include a table of likelihood values for each message element, for each interpretation of the message, indicating whether the required alterations of each message element are consistent with the waveform data for that message element. The outputs may further include an estimate of the uncertainty of each determination in that table, thereby assisting the receiver in deciding whether to act on the results or disregard them or request a retransmission, for example.

The model output is then compared 1809 to an independent determination 1808 or "ground truth" of the message element. The truth 1808 may be determined according to an unfaulted retransmission of the message, for example.

During development of the model, after each prediction is compared to the truth 1608, the adjustable variables are generally changed in some fashion, and the output is recalculated. If the result is in better agreement with the truth 1808, the variables may be further adjusted in the same fashion, and if the prediction is worse they may be reversed or adjusted in some other way. After the output 1807 has reached a satisfactory agreement with the truth, another message element may be presented at the inputs, and the process may be repeated. Typically millions or billions of examples are required to achieve good performance. When completed, the variables are typically frozen in their optimal values, although in some cases the user may be able to revise them to personalize the model.

A well-trained AI model may be able to perform complex tasks better than even an expert human, and in a small fraction of the time, at negligible cost after development. AI models tend to be most adept at solving problems that are highly complex, with multiple interacting or correlated parameters and highly nonlinear effects. In the context of waveform fault localization, AI may contribute beneficially in predicting which message elements of a message are most likely faulted. In addition, AI may be able to predict the correct value of the faulted message element by exploiting subtle and complex correlations in the input data. In addition, after accumulating data on multiple faults in multiple messages, another AI model may be trained to suggest when to switch to a different modulation scheme, and which scheme to use, based on the fault types observed, the QoS required, the size of messages, and other factors.

FIG. 19 is a flowchart showing an exemplary embodiment of a procedure for determining the probability that a message element is faulted according to the waveform of the message element, using an AI model, according to some embodiments. The flowchart items may be executed in any order. As depicted in this non-limiting example, an AI model 1902 takes, as input 1901, waveform data about the message element, such as fluctuations of the amplitude or phase observed during the message element, the amplitude and phase modulation deviations relative to a closest predetermined amplitude or phase level of the modulation scheme, the received amplitude for each message element, error-detection codes associated with the message, the measured polarization of the received message element, a frequency offset of each message element relative to the central frequency of the subcarrier, a measure of the smoothness or distortion of the waveform during transitions into and out of each message element's symbol-time, and possibly further parameters not directly related to the waveform such as the noise or interference levels (as measured during a non-transmission resource element, for example) and any demodulation references proximate to the message. The AI model may also take as input various threshold values, such as thresholds that indicate whether a particular waveform parameter or other parameter is an "outlier" and therefore more likely to be a fault. In addition, general inputs such as the numerology or bandwidth or time duration of the message element, the modulation scheme involved, and other data directly or indirectly related to message faults.

The AI model can also take as input a compilation of prior messages received by this receiver or similar receivers, a digest of the prior messages such as the occurrence of certain bit patterns or message element values, the expected form and format of the message according to its type on context, standards and rules governing how the message is to be configured, and other content-based information that may be correlated with a fault.

The AI model 1902 produces output 1903 including an estimate of the probability that each of the message elements is faulted. As an option, the AI model can also provide outputs such as a determination of the signal quality or suspiciousness of the message element based on the input data. In addition, the AI model, or another model using the same or similar input data, can estimate the uncertainty in each prediction. The model may also suggest a corrected value for the putative faulted message elements. If two or more message corrections are equally likely, then the AI model can flag the message as ambiguous or unparseable. The uncertainty of the prediction is especially valuable because it indicates whether the prediction is to be trusted and acted upon, or discarded as unreliable. Most AI models lack this important capability, and fail to indicate the uncertainty of the results to the user.

As a further option, the AI model may provide as output a tabulation of two or more candidate message versions. The probability of each version may then be calculated according to the faults assumed, and the corrections assumed, to generate each candidate version from the original faulted message. For example, if one of the candidate messages requires only one message element's modulation to be altered, and that message element exhibits a large amplitude fluctuation width, then the probability of the candidate message being correct would be relatively high. Another candidate message that requires multiple message elements to be altered, and some of those message elements have low suspiciousness, then the overall probability of that candidate message version would be extremely low. The AI model can then suggest the most likely candidate message version as the best guess, and can provide the uncertainty of that determination. If there are two or more candidate message versions with about the same high overall probability, then the AI model can indicate that the message as received is ambiguous. The receiver may decide to ignore an ambiguous message, or request a retransmission, or pick one of the candidate message versions, or other action depending on the application needs.

Figure 20:
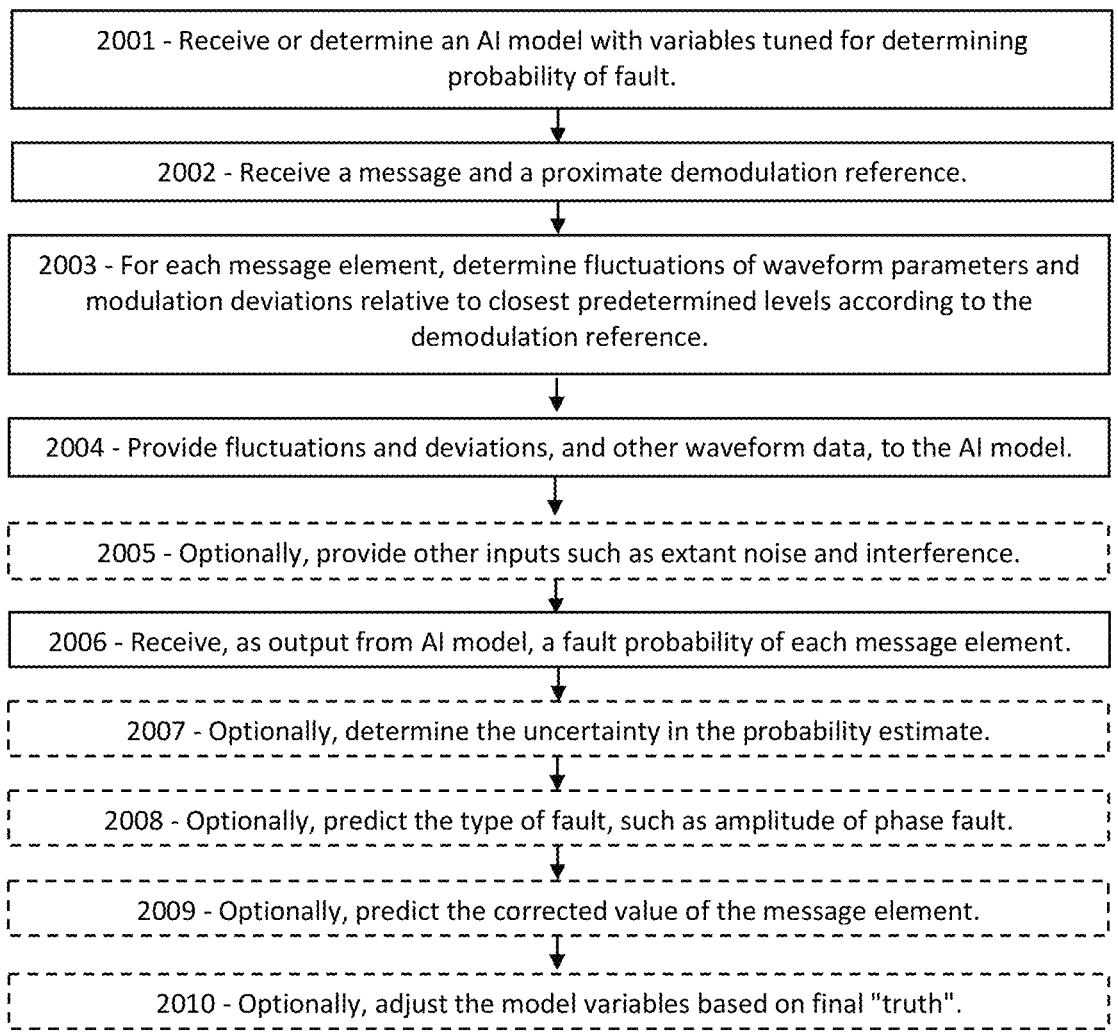
FIG. 20 is a flowchart showing an exemplary embodiment of a procedure for localizing a probably faulted message element, according to some embodiments.

FIG. 20 is a flowchart showing an exemplary embodiment of a procedure for localizing a likely faulted message element using an AI model, according to some embodiments. The flowchart items may be executed in any order. As depicted in this non-limiting example, at 2001 a wireless entity (base station, core network, user device, edge computer, or other wirelessly connected device) receives or determines or otherwise manages to use an AI model. The AI model includes a number of adjustable variables which have already been tuned (usually by another entity such as a supercomputer). The AI model is configured to determine the probability that each message element of a received message is faulted, based on the message element's waveform properties, message content, and other data.

At 2002, if not sooner, the wireless entity receives a demodulation reference which is concatenated with or embedded in or sufficiently proximate to the message, to serve as a fresh calibration of modulation levels for demodulating the message elements.

At 2003, each message element is demodulated by comparing its modulation state (or its amplitude or phase modulation values) to the predetermined modulation states (or modulation levels) as determined from the demodulation reference (or derived or calculated therefrom), and selecting the predetermined modulation level closest to the message element's modulation. For additional sensitivity, the amplitude or phase of each message element can be compared to the other message elements that have the same nominal modulation state, flagging any deviations from the average as suspicious. Then the waveform parameters of the message element's signal are analyzed to determine the fluctuations in amplitude or phase (or other waveform parameter) within the symbol-time of the message element, and also to determine the modulation deviations, in amplitude and/or phase of the message element signal relative to the closest predetermined amplitude or phase levels of the modulation scheme.

At 2004, the amplitude and phase fluctuation data, and the modulation deviation data, and optionally other data related to the waveform, and optionally other data not related to the waveform, are provided as inputs to the AI model. Optionally at 2005, certain operational or user-centric parameters such as the user's requested QoS, or a preference regarding retransmissions versus fault repairing, or a delay tolerance for example, are provided as further inputs. In addition, the context of the message, the form and format specified for messages of the present type, a historical compendium of prior messages of this type received by this receiver, a probability distribution of various bit sequences or character sequences for messages of the current type, and other historical data may be provided as further input.

At 2006, the AI model is executed on the input data and generates an output consisting of an estimate of the likelihood that each message element is faulted. Optionally 2007, the AI model can determine the uncertainty in the probability estimate, since an uncertain estimate is not as valuable as a high-confidence prediction. Optionally 2008, the type of each fault (amplitude or phase, adjacent or non-adjacent, etc.) can be determined as well. This may lead to appropriate mitigation such as changing the modulation scheme if the fault rate gets too high, and selecting a different modulation scheme according to the observed fault types. Optionally 2009, the AI model can consider the message content, using previous messages of a similar type, correlating most-probable and most-improbable bit sequences or symbol sequences according to message type, and/or the types of faults currently being detected in the network, for example.

Optionally 2010, the entity can attempt to refine the AI model by adjusting the model variables according to whether the prediction is correct or incorrect regarding the fault probability predictions for each message element. For example, if the AI model predicts, with high certainty, that a particular message element is faulted, and it later turns out that the message element is not faulted, the model may need some fine-tuning to avoid such errors in the future. Alternatively, if the prediction is correct, then the model variables related to the prediction may be "firmed", that is, made more resistant to future adjustment, to avoid losing the high-quality predictive power.

Figure 21:
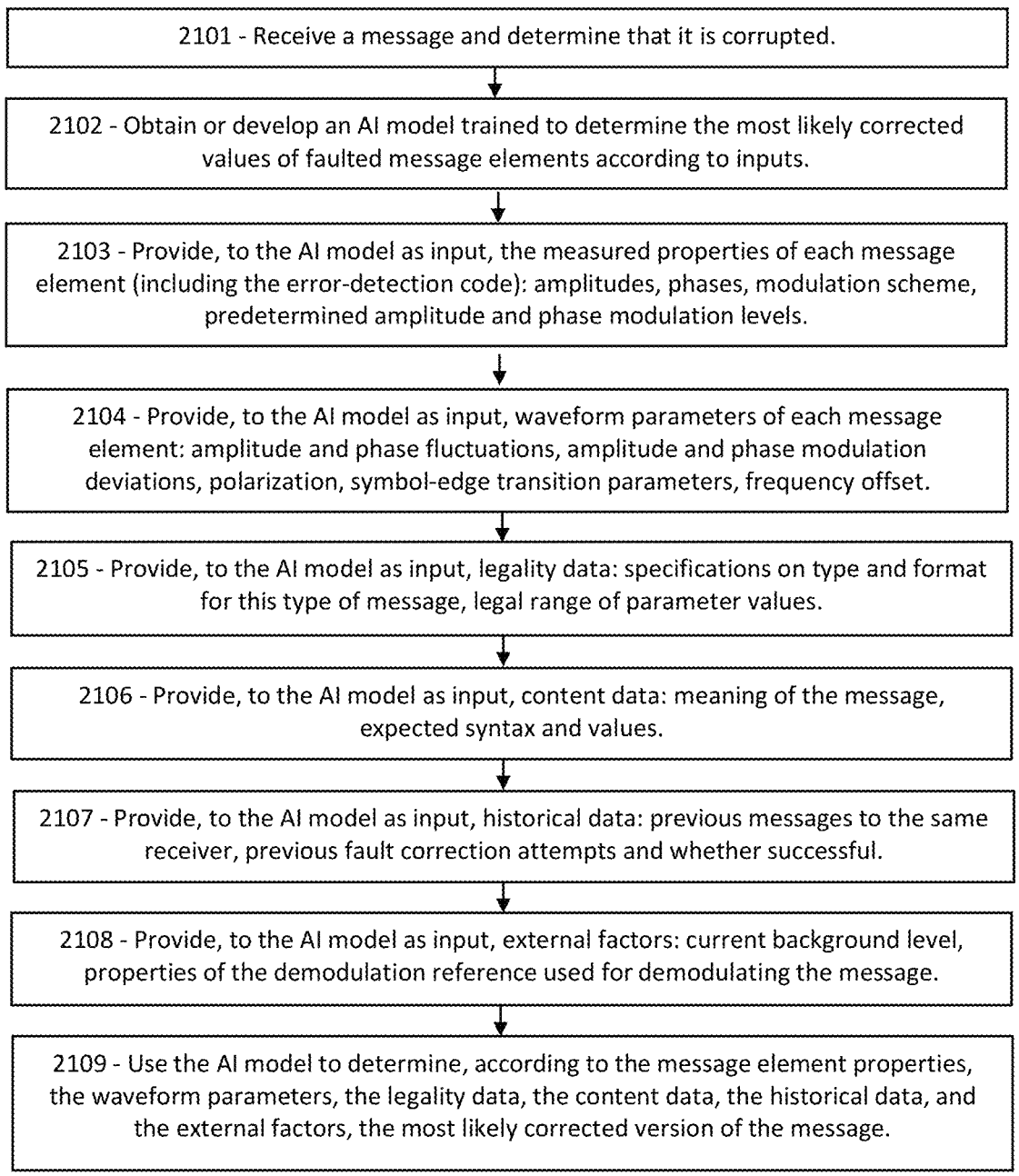
FIG. 21 is a flowchart showing an exemplary embodiment of a procedure for correcting a corrupted message using an AI model, according to some embodiments.

FIG. 21 is a flowchart showing an exemplary embodiment of a procedure for correcting a corrupted message using an AI model, according to some embodiments. The flowchart items may be executed in any order. As depicted in this non-limiting example, at 2101 a receiver receives a message and determines that it is corrupted. The determination may be based on an associated error-detection code, an illegal value in the message content, a conflict with an expected form or format according to the context, a nonsensical meaning or intent, or other indicator of corruption.

At 2102, if not sooner, the receiver (or an associated processor) obtains or develops or otherwise arranges to use an artificial intelligence model. The AI model has already been trained for determining a corrected version of a message, based on a large amount of previous input data on similar types of messages.

At 2103, the receiver provides, as input to the AI model, data on the measured properties of each message element of the corrupted message. For example, the measured properties may be the amplitudes and/or phases (depending on the modulation scheme), the predetermined modulation levels (according to a proximate demodulation reference), and other measured properties of each message element for demodulation. The error-detection code, if present, is included as part of the measured properties data, just like the rest of the message.

At 2104, the receiver provides, as further input to the AI model, waveform parameters of the signal in each message element. For example, the waveform parameters may include the fluctuations in amplitude and phase of each message element, the width of the fluctuation distribution, and its peak offset. The modulation deviations, relative to the predetermined modulation levels (or relative to the other same-modulation message elements), of each message element, may also be provided. Further waveform parameters such as the polarization, characteristics of the inter-symbol transitions, and frequency offset may be provided. (Alternatively, the raw amplitude and phase measurements can be provided as input, and the AI model can determine the comparisons and fluctuation distributions and so forth.)

At 2105, the receiver provides, as further input to the AI model, certain rules or "legality" data, such as the requirements and specifications for the current message type, its required form and format, and permissible ranges of syntax and parameter values.

At 2106, the receiver provides, as further input to the AI model, the content data of the message, such as the possible meanings or intents of the message in the current context. The content data may include data about the syntax and numerical parameters present in the message, or information about the application or context related to the message, or the expected intent of the message, for example.

At 2107, the receiver provides, as further input to the AI model, historical data such as a listing of previous messages to the current receiver, or to other receivers of the same message type. In addition, the historical data may include previous faults and fault mitigation attempts, by the current AI model or other models, and optionally the success or failure of such attempts. The AI model can learn from such prior attempts, and determine how to better recognize the faulted message elements, how to mitigate them, and how to avoid the pitfalls that have been seen before.

At 2108, the receiver provides, as further input to the AI model, external factors such as the current background level of electromagnetic radiation (as determined according to a proximate reference element with no local transmission therein), properties of the demodulation reference(s) which the receiver used to recalibrate the modulation levels that were then used to demodulate the message.

At 2109, the receiver activates the AI model, which processes the inputs and predicts the corrected value of the likely faulted message element. The AI model can also determine which message element is the most likely faulted, based on some or all of the same inputs. If multiple message elements are suspicious, the AI model may be able to evaluate the probability that each of them is faulted. The AI model may be able to determine, based on message content or historical data, what the most likely correct values are for each faulted message element. In cases where the AI model finds multiple possible corrected versions, the AI model may determine the probability of each of the possible corrected versions, and may select the most likely version. However, if two or more of the corrected versions are found with about the same high probability, the AI model may alert the receiver that the corrected version is ambiguous.

Figure 22:
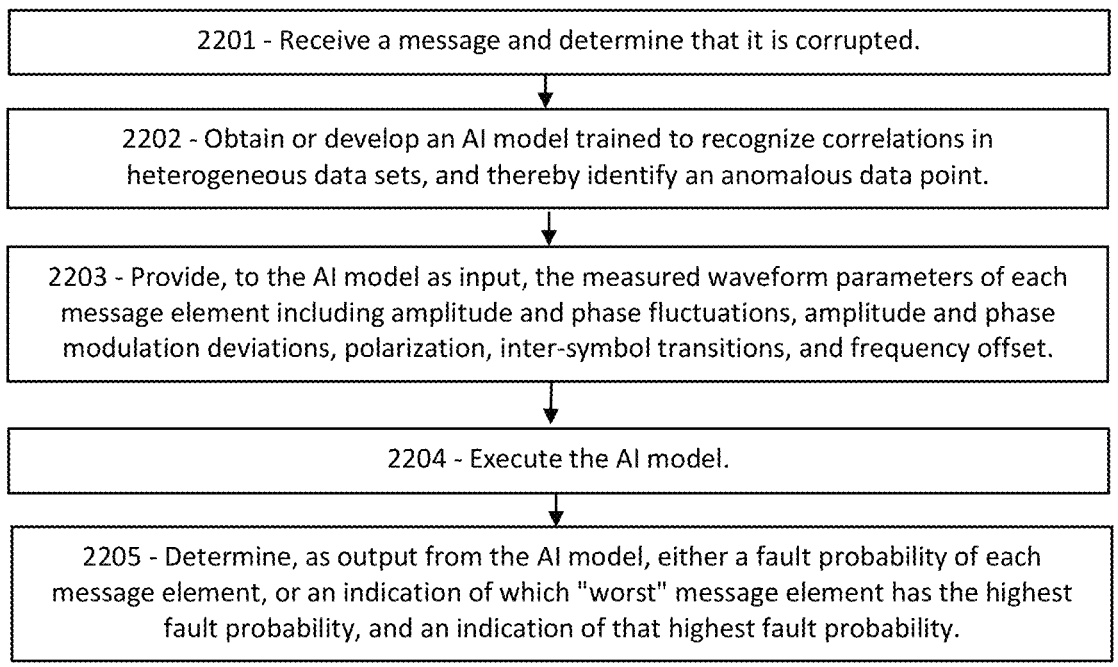
FIG. 22 is a flowchart showing an exemplary embodiment of a procedure for an AI model to select a worst message element according to correlations among waveform measurements, according to some embodiments.

FIG. 22 is a flowchart showing an exemplary embodiment of a procedure for an AI model to select a worst message element according to correlations among waveform measurements, according to some embodiments. The flowchart items may be executed in any order. As depicted in this non-limiting example, a receiver can use an AI model to search for subtle correlations among waveform parameters and non-waveform parameters of each message element, in combination with the error-detection code. AI excels in finding patterns and correlations in complex data fields. Such subtle or complex correlations may be sufficient to identify the faulted message element or elements, even when each individual measurement is inconclusive.

At 2201, a receiver receives a message and determines that it is corrupted, according to an error-detection code or an illegal value or a mis-format or other corruption indicator. At 2202 the receiver obtains an AI model trained to analyze heterogeneous data sets, such as the various waveform measurements, and extract from them certain hidden correlations, thereby indicating which message elements are likely faulted.

At 2203, the receiver provides the waveform parameters (the width of amplitude and phase fluctuations, the modulation deviations, among others mentioned above), and runs the model at 2204.

At 2205, the AI model provides output indicating the fault probability of each message element. Alternatively, the AI model can simply indicate which message element has a highest fault probability. In addition, the AI model may indicate the fault probability for that worst message element. As a further alternative, the AI model may indicate a number of message elements which all have a fault probability above a threshold value. In some embodiments, the AI model can report the signal quality or the suspiciousness or other measure of fault probability.

An advantage of using the AI model to analyze the message element data may be that artificial intelligence is often able to find correlations among parameters that humans cannot discern, even when told which correlations are present in the data. Instead of simply adding or averaging the fluctuation and deviation data, the AI model may develop a complex logical criterion such as "add 10% to the fault probability if the amplitude fluctuation width is greater than the phase fluctuation width when the polarization is less than the average modulation deviation, and subtract 5% from the fault probability otherwise unless the message has more than 15 message elements". Thus the AI model may be able to extract information related to the fault probability of each message element from patterns and correlations in the data that are entirely baffling to the human users. In this way, the AI model may be able to achieve higher success at identifying the faulted message element than expert readers.

Figure 23:
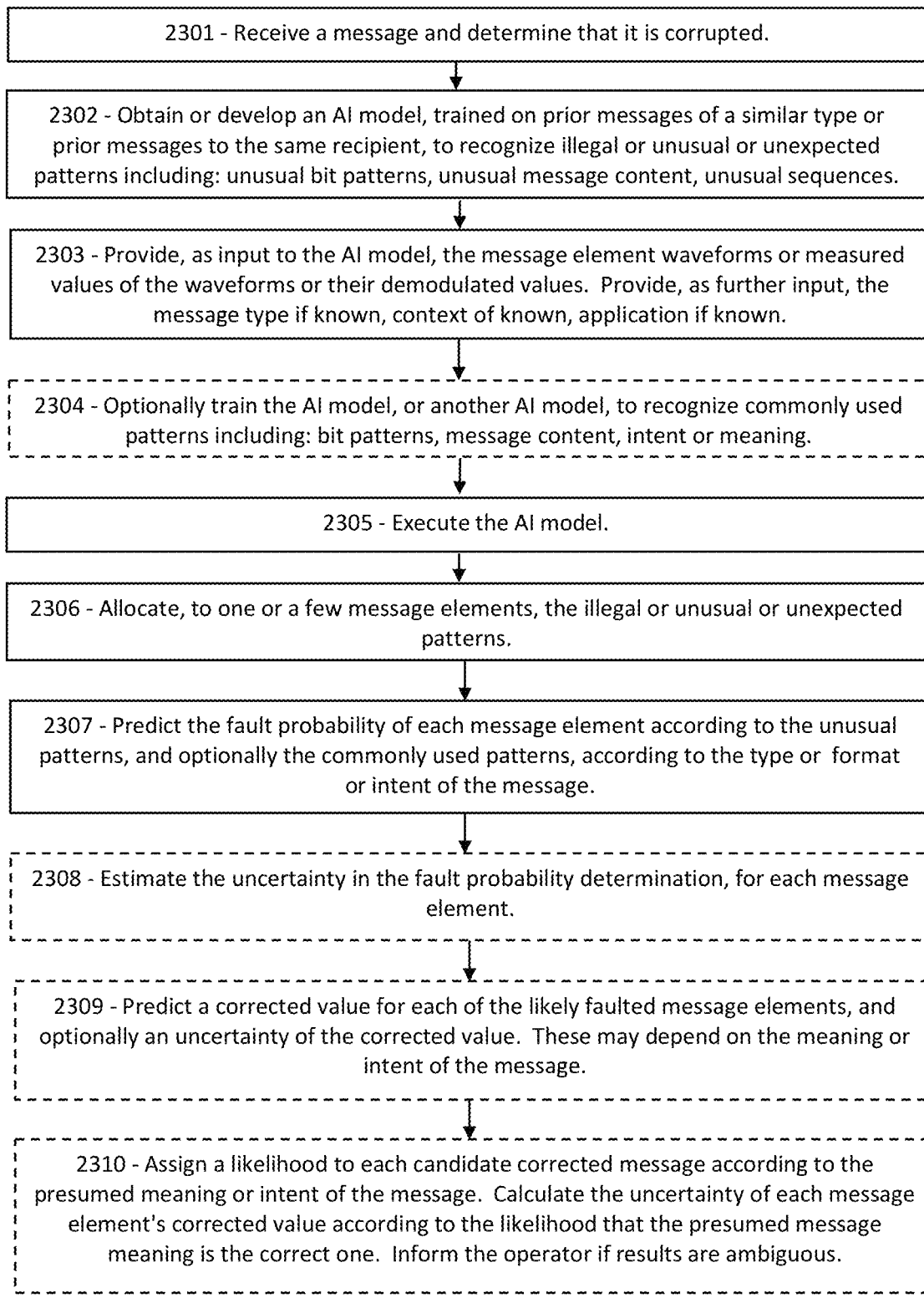
FIG. 23 is a flowchart showing an exemplary embodiment of a procedure for comparing a message to prior messages using an AI model, according to some embodiments.

FIG. 23 is a flowchart showing an exemplary embodiment of a procedure for using an AI model to compare a message to previous unfaulted messages of the same or similar types, according to some embodiments. The flowchart items may be executed in any order. As depicted in this non-limiting example, an AI model can learn the common patterns and sequences of non-faulted messages and then localize faulted message elements by comparison.

At 2301, a receiver receives a message and determines that it is corrupted. At 2302, the receiver, or a processor associated with the receiver, arranges to use an AI model which has been trained to recognize non-faulted messages as well as the most commonly encountered faults. For example, the AI model can base the inference on patterns such as bit sequences, sequences of characters in the message, ranges of variables, and the like. The AI model can also be given formatting rules and other conventions that messages are expected to follow, depending on type of message, for example.

At 2303, the AI model is also provided with measurement data on the individual message elements such as the amplitude and phase fluctuation distributions and modulation deviations, or values derived from them such as the width of the distributions and peak offsets, for example. As further input, the model may be provided with information on the type of message, the context or application, what type of message the application was expecting if known, and other data about the message itself. At 2304, optionally, the AI model may be configured to recognize legal or non-faulted messages according to the same patterns mentioned above.

At 2305, the receiver executes the AI model. The model determines whether any unusual or unexpected patterns have been detected in each message element. If so, at 2306 the receiver can (or the model can) allocate the message elements that include the unusual or unexpected patterns as suspicious or possibly faulted. Then at 2307, the AI model can assemble the above analyses including the expected or presumed type and format, and can thereby predict a fault probability for each of the message elements. Optionally, but very beneficially, the model can also provide an estimate of the uncertainty in that prediction at 2308.

As a further option, at 2309 the results of this method can be combined with the results of the other AI models described in the foregoing examples, thereby producing an overall assessment of the corrected value of each faulted message element taking account of all the information available to the model. The AI model may also calculate an uncertainty in each of the proposed corrections. For example, multiple meanings may be consistent with the faulted message, in which case the suggested fault corrections may depend on which meaning or intention was assumed by the AI model. The AI model can select the most likely meaning from among the candidate message versions, calculate the probability associated with each candidate message version, and thereby select the best guess as to the corrected message, as follows.

At 2310 the model can devise a number of possible message corrections according to different presumed meanings, each with a different set of corrections and each with a different probability of being the originally intended message. Then the AI model can calculate an overall fault probability and an overall correction probability for each message element according to each of the candidate messages. The AI model can then determine whether two or more of the candidate messages have about the same probability of being correct, by combining the probabilities of each correction of each faulted message element, and thereby select the message version that has the highest overall probability. However, if none of the candidate messages has a sufficiently high probability, or if two of them have about the same high probability estimate, then the AI model can alert the receiver or other entity that the message is undecodable, and recommend a retransmission.

Figure 24:
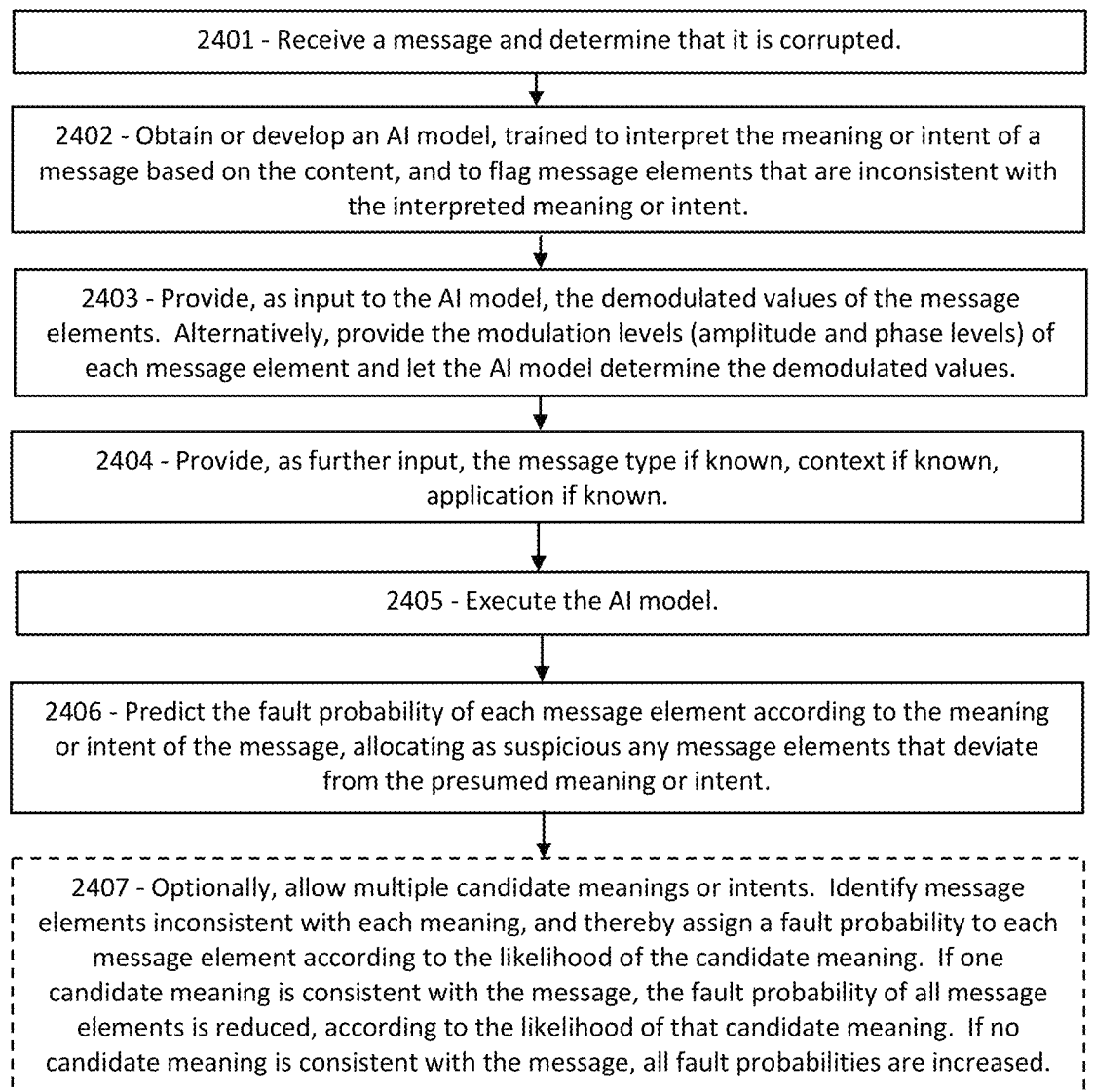
FIG. 24 is a flowchart showing an exemplary embodiment of a procedure for using an AI model to determine the meaning or intent of a message, according to some embodiments.

FIG. 24 is a flowchart showing an exemplary embodiment of a procedure for using an AI model to determine the meaning or intent of a message, according to some embodiments. The flowchart items may be executed in any order. As depicted in this non-limiting example, a receiver can localize faults using an AI model trained on prior messages, by detecting similarities or differences relative to those prior messages.

At 2401, the receiver receives a wireless message and determines that it is corrupted. At 2402, the receiver obtains or develops an AI model configured to search for unexpected patterns in the message, such as illegal values or unusual content. The AI model may detect patterns in the bits of the message, or in the demodulated message elements, or in other unexpected sequences in the message.

At 2403, the receiver provides the demodulated values of the message elements to the AI model. Alternatively, the receiver can supply the raw modulation levels (amplitudes and phases) along with the predetermined modulation levels (from a demodulation reference close to the message for example) and allow the AI model to perform the demodulation. At 2404, the message type and context are also provided, and the model is executed at 2405.

At 2406, the AI model provides outputs predicting the fault probability of each message element based on the meaning and intent of the message as best "understood" by the model. It also indicates which message elements deviate from the favored message interpretation, by specifying an illegal value or violating a format or other unlikely message element value, all in view of the putative meaning.

At 2407, optionally, the AI model can explore to a deeper level by preparing a number of candidate messages, each with a different meaning or intent, and each candidate message having a different set of faulted message elements along with their corrected values. The AI model can then prepare a table or matrix indicating each message element's fault probability for each of the candidate messages. The AI model can then calculate an overall probability for each candidate message, and can also adjust the fault probability of each message element according to the probability values of the candidate messages. The AI model can then select the candidate message with the highest overall probability as the favored interpretation. However, if none of the candidate messages has an overall probability higher than some threshold, such as 90%, the receiver can determine that the message is unparseable and request a retransmission, or simply ignore it, depending on application preferences. In addition, if two or more of the candidate messages have similar high probability estimates, then again the receiver may give up and request a retransmission.

In some embodiments, the AI model may be configured to calculate the uncertainty in each of the derived outputs, such as the probability of each candidate message, and the fault probability of each message element, and its proposed correct value according to the favored interpretation.

FIG. 25 is a chart showing an exemplary embodiment of probability values for each message element and each of the modulation states, according to some embodiments. As depicted in this non-limiting example, a receiver has measured the waveform parameters and other parameters associated with each message element, and assigned probabilities as to the modulation state of the message element. The receiver has also determined an overall probability that each message element is faulted, regardless of the particular modulation state.

An AI model has analyzed a corrupted message in view of waveform measurements of each message element, along with other inputs. The AI model has then constructed a table 2500 which shows the probability that the proper value of message element is each of eight modulation states (A, B, etc.) of a modulation scheme, based on the waveform data and the other inputs. In this case, the message has 12 message elements as indicated by 12 lines in the table (but only four are filled in, for simplicity). Each column corresponds to one of the eight modulation states. The table entry shows the probability that the correct value of the message element is the modulation state listed at the top. Also shown, in a final column 2505, is an overall probability that each of the message elements is faulted.

The first message element 2501 has all zeroes except a single "1" for the modulation state "D". This means that the first message element 2501 is known with high confidence to be a "D". Accordingly, its fault probability is shown as zero in the fault probability column 2505.

The second message element 2502 has a probability of 0.9 to be the state "B" and 0.1 probability to be a "D". Therefore the second message element is most probably a "B" but not with complete certainty. Accordingly, its fault probability is slightly raised to 0.05.

The third message element 2503 has 0.6 for state "E" and 0.4 for state "F". Consequently, it may be an "E" but could well be something else. Hence its fault probability is high, 0.7.

The fourth message element 2504 is all zeroes. This indicates that its modulation deviation was so large, or its amplitude fluctuations were so high, or another parameter was so extreme, that none of the modulation states was consistent with the waveform of the message element. Therefore, it is certainly faulted, and hence the fault probability is a full 1.0 in the last column 2505.

The AI model can then determine, based on the table, which message elements are likely faulted. Depending on the specific data, the AI model may also estimate the most probable corrected values for each likely faulted message element. If there are more faults than the error-detection code can accommodate, the AI model can guide the mitigation process anyway, such as altering the message elements that have the worst waveform parameters, and replacing them with to other modulation states consistent with the waveform data, and then determining whether the altered version passes an error-detection test or a reasonableness test based on the content of the message.

If the AI model finds that multiple candidate message versions are possible according to the waveform data (and the context), then the AI model can calculate an overall probability for each of the candidate versions based on the probability values in the table 2500, or alternatively on the net fault probabilities 2505, and may thereby select the best candidate message version for subsequent action. Optionally, but preferably, the AI model may also indicate the estimated uncertainty in this selection.

FIG. 26 is a flowchart showing an exemplary embodiment of a procedure for using an AI model to correlate waveform data with an error-detection code to mitigate faults, according to some embodiments. The flowchart items may be executed in any order. As depicted in this non-limiting example, the receiver, or a processor associated with the receiver, is configured at 2601 to use an AI model that has been trained to detect and correct faults based on the waveform data of each message element in combination with the associated error-detection code.

At 2602, the receiver receives a message and compares it to the associated error-detection code at 2603. If agreement, the task is done at 2604. If not, at 2605 the receiver provides the waveform data and code data as inputs to the AI model.

At 2606, the receiver or processor determines, from the AI model output, the most likely corrected message version. Optionally, at 2607, the output may also include a listing of the fault locations, the fault types (such as adjacent-amplitude faults, non-adjacent phase faults, etc.), bit sequences or message element sequences involved in the fault, and other information about the detected faults, for tallying systematic errors.

Optionally, at 2608, the processor or the AI model can check the most likely solution for "reasonableness", which represents a general consistency with the application or the types of messages expected by the application. Reasonableness is application-dependent and often implementation-dependent, so is hard to quantify in general. In some embodiments, reasonableness may be related to the previously accepted messages of the receiver, such that a corrected message that matches one of the previously received (unfaulted) messages would have an increased reasonableness evaluation, whereas a supposedly corrected message version different from all previous received messages would have its reasonableness reduced. In some embodiments, a list of expected message forms may be provided to the AI model, in which case the corrected message would have an increased reasonableness evaluation if it complies with one of the expected forms, and a lower reasonableness if not. The AI model may know which message elements are variable and which are fixed, according to type, so that variations in the fixed message elements would reduce the reasonableness, but not the normally variable ones. In addition, the AI model may be trained to judge the reasonableness of the candidate messages based on examples provided during the training, based on human judgement of the reasonableness of the training examples. Alternatively, another AI model specializing in fuzzy, poorly-specified correlations may be trained to evaluate the reasonableness of the corrected message in the current context. For example, if the receiver is in a vehicle on the highway and the true message was "Hit the brakes!" whereas the corrected message became "Hold the onions!", the AI model may determine that the reasonableness of this solution is very low, even if it matches the error-detection code (in which case the error-detection code itself is probably faulted). The receiver or processor may then ignore the output and request a retransmission, or attempt to fix both the message and the error-detection code.

Optionally, at 2609, the receiver or processor may have an opportunity to review the corrected message at a later time, after receiving further information such as a copy of the true message, or after determining the effect of the corrected message on the application, for example. If the correction is then determined to be inadequate, certain variables of the AI model may be adjusted to improve the error-mitigation performance. Another AI model may be assigned to perform this review and select which variables of the first model are to be adjusted.

FIG. 27 is a flowchart showing another exemplary embodiment of a procedure for using an AI model to correlate waveform data with an error-detection code to mitigate faults, according to some embodiments. The flowchart items may be executed in any order. As depicted in this non-limiting example, at 2701 a receiver provides, as input to an AI model, waveform data for each message element (including the error-detection code as part of the message). The waveform data may include the various measurements discussed above related to the received signal.

At 2702, the message content data is provided to the AI model, such as the demodulated message elements, the type and form and format of the message as determined, the demodulation reference(s) used for demodulating the message, and waveform data for the demodulation reference since it may be faulted as well. If the demodulation reference is suspected to be faulted, based on its waveform data for example, then that demodulation reference may be ignored and another proximate demodulation reference may be used instead. If there are no other proximate demodulation references, the receiver may opt to request a retransmission, or it may attempt to demodulate using an older "expired" demodulation reference, depending on the implementation.

At 2703, data regarding the error-detection code is provided to the AI model, such as the waveform data of the error-detection code, the expected type of error-detection code and its predetermined parameters if not already known to the AI model, the content of the error-detection code in terms of bits or demodulated resource elements, and other information related to the error-detection code.

At 2704, various other information is provided to the AI model, such as environmental data including the current noise and interference level (including amplitude and phase of interference) as determined from signals received in a resource element without local transmission, historical data such as certain bit sequences or message sequences that occur frequently, and other sequences that almost never occur for this receiver or for this type of message, and context data such as the expected message type according to the current application needs, the expected intent or meaning of input messages in the current situation, and other content/context related data.

At 2705, the AI model uses the inputs to calculate outputs.

At 2706, the AI model outputs are provided, such as the most likely version of the corrected message. In addition, optionally, the output can include a listing of other possible versions of the corrected message, including the likelihood values of each candidate version. The output can also include alarms or alerts based on a conflict, such as finding two different high-likelihood versions, or determining that the likelihood of the best solution is low, for example. The receiver can request a retransmission in that case. Alternatively, the AI model can estimate the uncertainty in the output, such as the uncertainty in the likelihood value of the best solution. The output may include a listing of the fault locations and the fault types determined according to the waveform and code data, and similarly for the other candidate versions. The output may also include an evaluation of the message intent or meaning, and whether that meaning is reasonable in the current context.

Finally, not shown, if a retransmission is requested, the AI model can compare the two received message versions and determine locations of faults and fault types in the two versions. If the retransmitted version agrees with its error-detection code as-received, then that version may be considered the true message. Then the success or failure of the earlier fault mitigation attempt may be judged by the AI model, or another AI model. Based on an analysis of the previous attempt at fault localization and correction, the second AI model may recommend changes to the variables of the first AI model to avoid systematic problems in fault mitigation thereafter.

Manner of Implementation

Fault detection, localization, and correction by an AI model, based on combinations of waveform data and the error-detection code, as disclosed herein, may be implemented in software or firmware, enabling base stations or user devices to repair corrupted messages themselves, without relying on an edge computer, and without requesting a retransmission in many cases. The mitigation may also provide valuable data on fault types and fault rates for each user. The fault analysis may reveal certain modulation states that are frequently faulted. For example, certain pairs of states in 16QAM are only 34 degrees apart, whereas other pairs are 90 degrees apart in waveform phase. Hence the message failures may indicate a higher probability of phase faulting between the closely-spaced states than the widely-spaced pairs.

Rapid fault localization and mitigation by the receiver, using an AI model as disclosed herein, may enable increased overall reliability, and greatly reduced latency relative to retransmissions, while consuming far less resources and radiated power than forward-error-correcting codes and the like.

The wireless embodiments of this disclosure may be aptly suited for cloud backup protection, according to some embodiments. Furthermore, the cloud backup can be provided cyber-security, such as blockchain, to lock or protect data, thereby preventing malevolent actors from making changes. The cyber-security may thereby avoid changes that, in some applications, could result in hazards including lethal hazards, such as in applications related to traffic safety, electric grid management, law enforcement, or national security.

In some embodiments, non-transitory computer-readable media may include instructions that, when executed by a computing environment, cause a method to be performed, the method according to the principles disclosed herein. In some embodiments, the instructions (such as software or firmware) may be upgradable or updatable, to provide additional capabilities and/or to fix errors and/or to remove security vulnerabilities, among many other reasons for updating software. In some embodiments, the updates may be provided monthly, quarterly, annually, every 2 or 3 or 4 years, or upon other interval, or at the convenience of the owner, for example. In some embodiments, the updates (especially updates providing added capabilities) may be provided on a fee basis. The intent of the updates may be to cause the updated software to perform better than previously, and to thereby provide additional user satisfaction.

The systems and methods may be fully implemented in any number of computing devices. Typically, instructions are laid out on computer readable media, generally non-transitory, and these instructions are sufficient to allow a processor in the computing device to implement the method of the invention. The computer readable medium may be a hard drive or solid state storage having instructions that, when run, or sooner, are loaded into random access memory. Inputs to the application, e.g., from the plurality of users or from any one user, may be by any number of appropriate computer input devices. For example, users may employ vehicular controls, as well as a keyboard, mouse, touchscreen, joystick, trackpad, other pointing device, or any other such computer input device to input data relevant to the calculations. Data may also be input by way of one or more sensors on the robot, an inserted memory chip, hard drive, flash drives, flash memory, optical media, magnetic media, or any other type of file-storing medium. The outputs may be delivered to a user by way of signals transmitted to robot steering and throttle controls, a video graphics card or integrated graphics chipset coupled to a display that may be seen by a user. Given this teaching, any number of other tangible outputs will also be understood to be contemplated by the invention. For example, outputs may be stored on a memory chip, hard drive, flash drives, flash memory, optical media, magnetic media, or any other type of output. It should also be noted that the invention may be implemented on any number of different types of computing devices, e.g., embedded systems and processors, personal computers, laptop computers, notebook computers, net book computers, handheld computers, personal digital assistants, mobile phones, smart phones, tablet computers, and also on devices specifically designed for these purpose. In one implementation, a user of a smart phone or Wi-Fi-connected device downloads a copy of the application to their device from a server using a wireless Internet connection. An appropriate authentication procedure and secure transaction process may provide for payment to be made to the seller. The application may download over the mobile connection, or over the Wi-Fi or other wireless network connection. The application may then be run by the user. Such a networked system may provide a suitable computing environment for an implementation in which a plurality of users provide separate inputs to the system and method.

It is to be understood that the foregoing description is not a definition of the invention but is a description of one or more preferred exemplary embodiments of the invention. The invention is not limited to the particular embodiments(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. For example, the specific combination and order of steps is just one possibility, as the present method may include a combination of steps that has fewer, greater, or different steps than that shown here. All such other embodiments, changes, and modifications are intended to come within the scope of the appended claims.

As used in this specification and claims, the terms "for example", "e.g.", "for instance", "such as", and "like" and the terms "comprising", "having", "including", and their other verb forms, when used in conjunction with a listing of one or more components or other items, are each to be construed as open-ended, meaning that the listing is not to be considered as excluding other additional components or items. Other terms are to be construed using their broadest reasonable meaning unless they are used in a context that requires a different interpretation.

The invention claimed is:

1. A method for a wireless receiver to demodulate a message, the method comprising:
   a) receiving a received message and a received error-detection code;
   b) determining, according to a disagreement between the received message and the received error-detection code, that the received message or the received error-detection code, or both, is or are corrupted;
   c) providing, as input to an artificial intelligence ("AI") model, the received message and the received error-detection code;
   d) determining, as output from the AI model, a plurality of candidate versions, each version comprising:
      i) a candidate message;
      ii) a candidate error-detection code that is consistent with the candidate message; and
      iii) a likelihood value indicating an estimated likelihood that the candidate message is correct;
   e) wherein, for each version:
      i) when the candidate message differs from the received message, the candidate error-detection code equals the received error-detection code; and
      ii) when the candidate error-detection code differs from the received error-detection code, the candidate message equals the received message.

2. The method of claim 1, wherein the message is transmitted according to 5G or 6G technologies.

3. The method of claim 1, further comprising providing, as further input to the AI model, a plurality of expected messages.

4. The method of claim 3, wherein the expected messages comprise messages previously received by the receiver.

5. The method of claim 3, wherein the expected messages comprise AI-generated messages generated by the AI model or a different AI model.

6. The method of claim 3, wherein, for each candidate version, the likelihood value is based at least in part on a comparison between the received message and the expected messages.

7. The method of claim 3, wherein, for each candidate version, the likelihood value is higher when the candidate message is an expected message, and the likelihood value is lower when the candidate message is not an expected message.

8. The method of claim 1, wherein, for each candidate version, the likelihood value is based at least in part on a meaning or intent of the received message, as determined by the AI model.

9. Non-transitory computer-readable media in a wireless receiver, the non-transitory computer-readable media containing instructions that, when executed by a computing environment, cause a method to be performed, the method comprising:
   a) using an artificial intelligence ("AI") model which has been trained to determine a likelihood value of a message comprising symbols, according to data about the wireless receiver and the message symbols;
   b) receiving a received message and a received error-detection code, and determining, according to a disagreement between the received message and the received error-detection code, that the received message or the received error-detection code, or both, is or are faulted;
   c) providing, as input to the AI model, the received message and the received error-detection code; and
   d) determining, as output from the AI model, a plurality of candidate versions, each candidate version comprising a candidate message, a candidate error-detection code consistent with the candidate message, and a likelihood value indicating a likelihood that the candidate message is correct.

10. The non-transitory computer-readable media of claim 9, the method further comprising providing, as further input to the AI model, data about a current activity of the wireless receiver, wherein the likelihood value of each candidate version is based at least in part on a determination, by the AI model, whether the candidate message is related to the current activity or is a common response to the current activity.

11. The non-transitory computer-readable media of claim 10, wherein for each candidate version, the likelihood value is higher when the AI model determines that the candidate message is related to, or a common response to, the current activity, and is lower when the AI model determines that the candidate message is neither related to, nor a common response to, the current activity.

12. The non-transitory computer-readable media of claim 9, the method further comprising providing, as further input to the AI model, data about prior messages received by the receiver, wherein:
   a) the likelihood value of each candidate version is higher when the candidate message is included in the prior messages or is closely related to one of the prior messages, as determined by the AI model; and
   b) the likelihood value of each candidate version is lower when the candidate message is not included in the prior messages and is not closely related to any of the prior messages, as determined by the AI model.

13. The non-transitory computer-readable media of claim 9, wherein the AI model is configured to determine the likelihood value of each candidate message, based at least in part on one or more example messages provided to the AI model during training.

14. The non-transitory computer-readable media of claim 9, the method further comprising providing, as further input to the AI model, an indication of which symbols of the received message are predetermined by a format rule, wherein each likelihood value is lower when at least one of the symbols violates the format rule, and is higher when all of the symbols of the candidate message obey the format rule.

15. A method for a wireless receiver to correct a message fault, the method comprising:
   a) receiving a message comprising an error-detection code, and determining, according to a disagreement between the message and the error-detection code, that the message or the error-detection code, or both, is or are corrupted;
   b) providing, as input to an artificial intelligence ("AI") model, the message and the error-detection code;
   c) determining, as output from the AI model, a plurality of candidate messages, and a likelihood value associated with each of the candidate messages, the likelihood value indicating a likelihood that the candidate message is correct.

16. The method of claim 15, further comprising providing, as further input to the AI model, data about a context of the message, and determining, as further output of the AI model, a meaning or intent of the message, wherein the context comprises a current or planned action related to the message or to the wireless receiver.

17. The method of claim 16, wherein the current or planned action comprises an action commonly associated with the message, as determined by the AI model.

18. The method of claim 16, wherein the current or planned action is consistent with a meaning or intent of the message, as determined by the AI model.

19. The method of claim 16, wherein for each candidate message, the likelihood value is higher when the candidate message is commonly received in the context of the message, as determined by the AI model, and is lower when the candidate message is rarely or never received in the context of the message, as determined by the AI model.

20. The method of claim 15, further comprising determining, as further output from the AI model, that none of the likelihood values is greater than a threshold value, and responsively transmitting a request for a retransmission of the message.

* * * * *